(12) United States Patent
Wang et al.

(10) Patent No.: US 12,135,502 B2
(45) Date of Patent: Nov. 5, 2024

(54) RESIN, PHOTORESIST COMPOSITION, AND METHOD OF MANUFACTURING SEMICONDUCTOR DEVICE

(71) Applicant: TAIWAN SEMICONDUCTOR MANUFACTURING COMPANY, LTD., Hsinchu (TW)

(72) Inventors: Siao-Shan Wang, Tainan (TW); Ching-Yu Chang, Yuansun Village (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/231,444

(22) Filed: Aug. 8, 2023

(65) Prior Publication Data

US 2023/0393467 A1  Dec. 7, 2023

Related U.S. Application Data

(62) Division of application No. 17/220,705, filed on Apr. 1, 2021.

(Continued)

(51) Int. Cl.
*G03F 7/038* (2006.01)
*C08L 25/08* (2006.01)
*C08L 33/10* (2006.01)
*C08L 33/16* (2006.01)
*G03F 7/004* (2006.01)
(Continued)

(52) U.S. Cl.
CPC ............ *G03F 7/0388* (2013.01); *C08L 33/16* (2013.01); *G03F 7/0045* (2013.01); *G03F 7/027* (2013.01); *G03F 7/168* (2013.01); *G03F 7/2004* (2013.01); *G03F 7/40* (2013.01); *C08L 25/08* (2013.01); *C08L 33/10* (2013.01)

(58) Field of Classification Search
CPC ........ G03F 7/0397; G03F 7/0388; G03F 7/38; G03F 7/40; C08L 25/08; C08L 33/10; C08L 33/08
See application file for complete search history.

(56) References Cited

U.S. PATENT DOCUMENTS 8,796,666 B1   8/2014   Huang et al.
9,093,530 B2   7/2015   Huang et al.
(Continued)

FOREIGN PATENT DOCUMENTS

TW         202002106 A      1/2020

OTHER PUBLICATIONS

Non-Final Office Action issued in U.S. Appl. No. 17/220,705, dated Mar. 30, 2023.

*Primary Examiner* — John S Chu
(74) *Attorney, Agent, or Firm* — STUDEBAKER & BRACKETT PC

(57) ABSTRACT

A method for manufacturing a semiconductor device includes forming a photoresist layer including a photoresist composition over a substrate. The photoresist layer is selectively exposed to actinic radiation to form a latent pattern and the latent pattern is developed by applying a developer to the selectively exposed photoresist layer to form a patterned photoresist. The photoresist composition includes a photoactive compound and a resin comprising a radical-active functional group and an acid labile group.

20 Claims, 25 Drawing Sheets

Related U.S. Application Data

(60) Provisional application No. 63/017,881, filed on Apr. 30, 2020.

(51) Int. Cl.
*G03F 7/027* (2006.01)
*G03F 7/16* (2006.01)
*G03F 7/20* (2006.01)
*G03F 7/40* (2006.01)

(56) References Cited

U.S. PATENT DOCUMENTS

| | | | |
|---|---|---|---|
| 9,213,234 B2 | 12/2015 | Chang | |
| 9,223,220 B2 | 12/2015 | Chang | |
| 9,256,133 B2 | 2/2016 | Chang | |
| 9,405,189 B2 | 8/2016 | Cho et al. | |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 10,861,710 B2 | 12/2020 | Kuo et al. | |
| 2014/0227636 A1 | 8/2014 | Hirano et al. | |
| 2014/0273521 A1 | 9/2014 | Wu et al. | |
| 2015/0140484 A1 | 5/2015 | Takizawa et al. | |
| 2015/0185610 A1 | 7/2015 | Hirano et al. | |
| 2015/0185612 A1 | 7/2015 | Kawabata et al. | |
| 2015/0253671 A1* | 9/2015 | Komatsu | G03F 7/038 430/285.1 |
| 2016/0147155 A1 | 5/2016 | Takizawa et al. | |
| 2018/0362752 A1 | 12/2018 | Aqad et al. | |

* cited by examiner

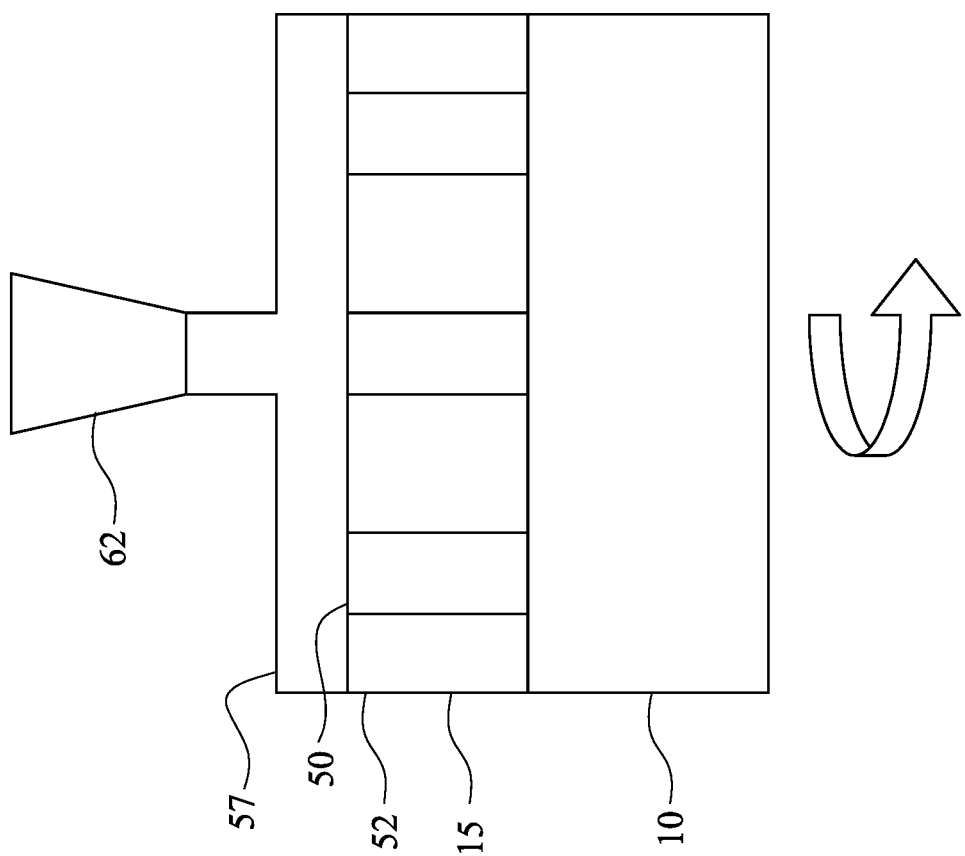

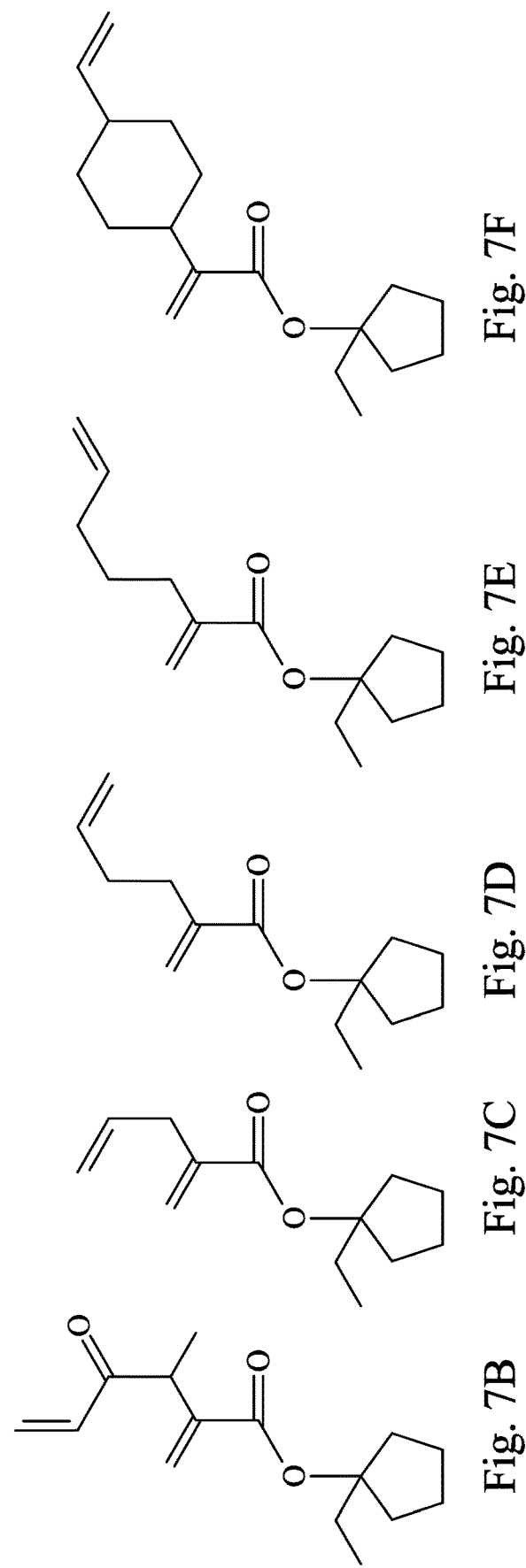

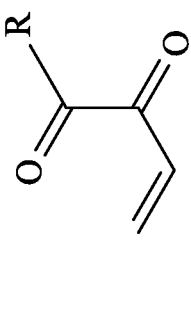
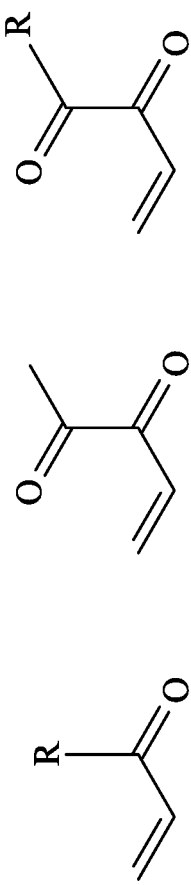
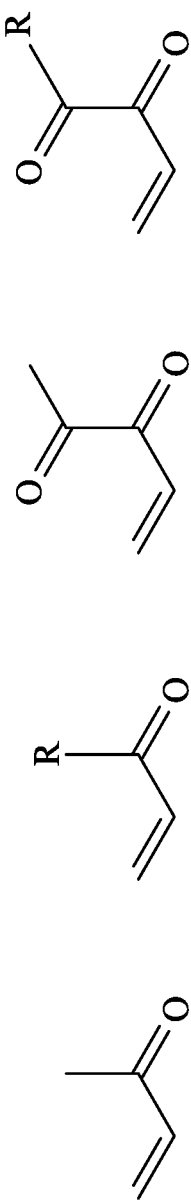
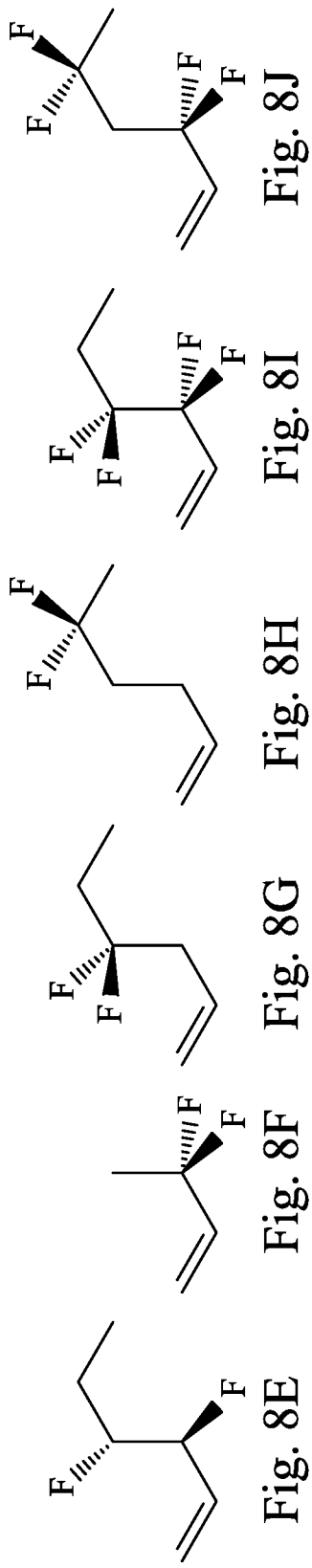
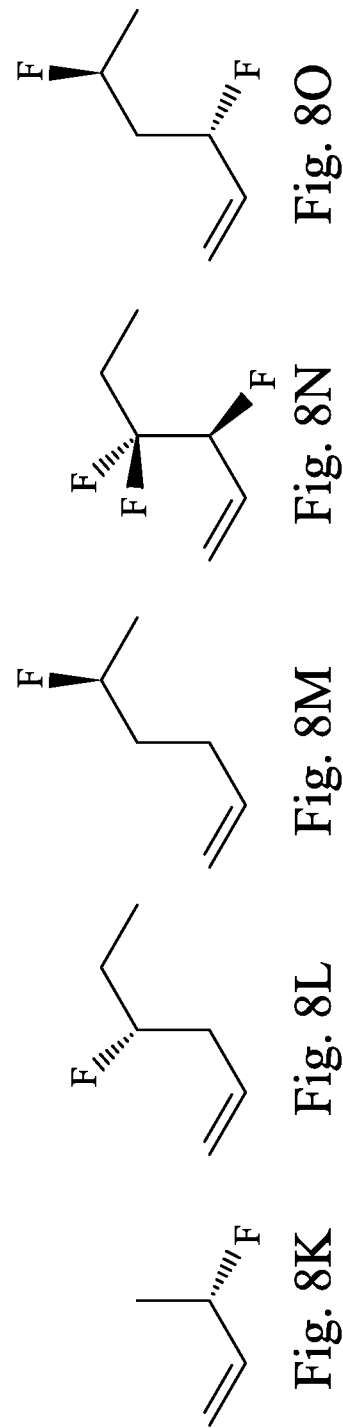

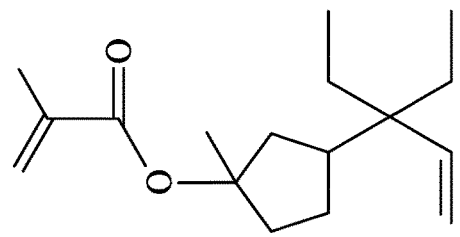
Fig. 9K
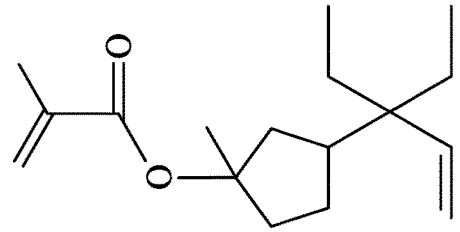
Fig. 9J
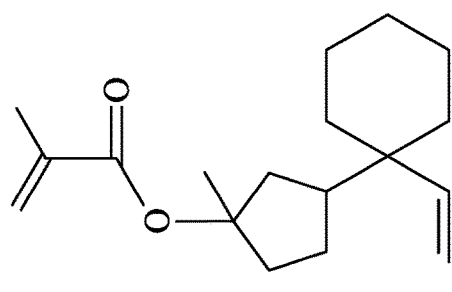
Fig. 9G
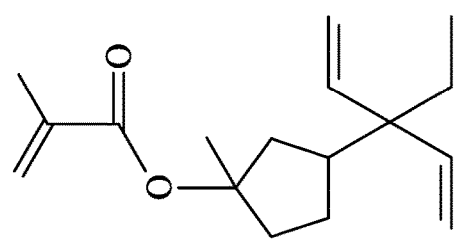
Fig. 9I
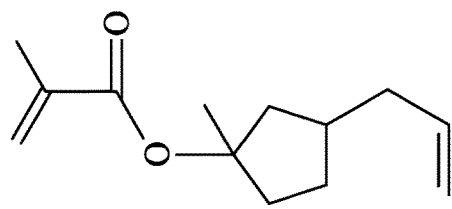
Fig. 9F
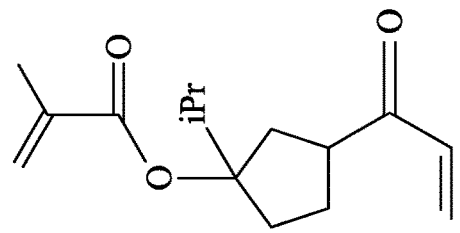
Fig. 9H
Fig. 9E
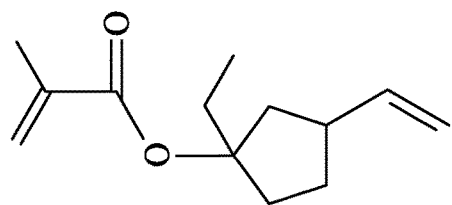
Fig. 9D
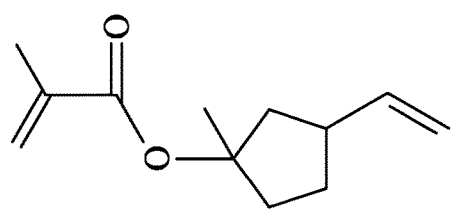

RESIN, PHOTORESIST COMPOSITION, AND METHOD OF MANUFACTURING SEMICONDUCTOR DEVICE

CROSS-REFERENCE TO RELATED APPLICATION

This application is a divisional application of U.S. application Ser. No. 17/220,705, filed Apr. 1, 2021, which claims priority to U.S. Provisional Patent Application No. 63/017,881, filed Apr. 30, 2020, the entire disclosures of each of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photospeed. Low exposure dose may lead to increased line width roughness and reduced critical dimension uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 4 shows a process stage of a sequential operation according to an embodiment of the disclosure.

FIGS. 7B, 7C, 7D, 7E, and 7F show examples of monomer units containing an acid labile group and a linker group according to some embodiments of the disclosure.

FIGS. 8A, 8B, 8C, and 8D show carbonyl group linker groups and radical-active functional group substituents for resins according to some embodiments of the disclosure. FIGS. 8E, 8F, 8G, 8H, 8I, 8J, 8K, 8L, 8M, 8N, and 8O show electron-withdrawing groups and radical-active functional group substituents for resins according to some embodiments of the disclosure.

FIGS. 9D, 9E, 9F, 9G, 9H, 9I, 9J, 9K, 9L, 9M, 9N, 9O, 9P, 9Q, 9R, and 9S show examples of resin monomer units according to some embodiments of the disclosure having one or two linker groups.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated degrees or at other orientations) and the spatially relative descriptors used herein may likewise be interpreted accordingly. In addition, the term "made of" may mean either "comprising" or "consisting of."

As semiconductor device size shrinks, the dimensions of photoresist patterns correspondingly shrinks and maintaining a desirable aspect ratio of the photoresist pattern becomes more challenging. High aspect ratio photoresist patterns may suffer from pattern collapse, while low aspect ratio photoresist patterns may have insufficient thickness to withstand subsequent etching operations.

Figure 1:
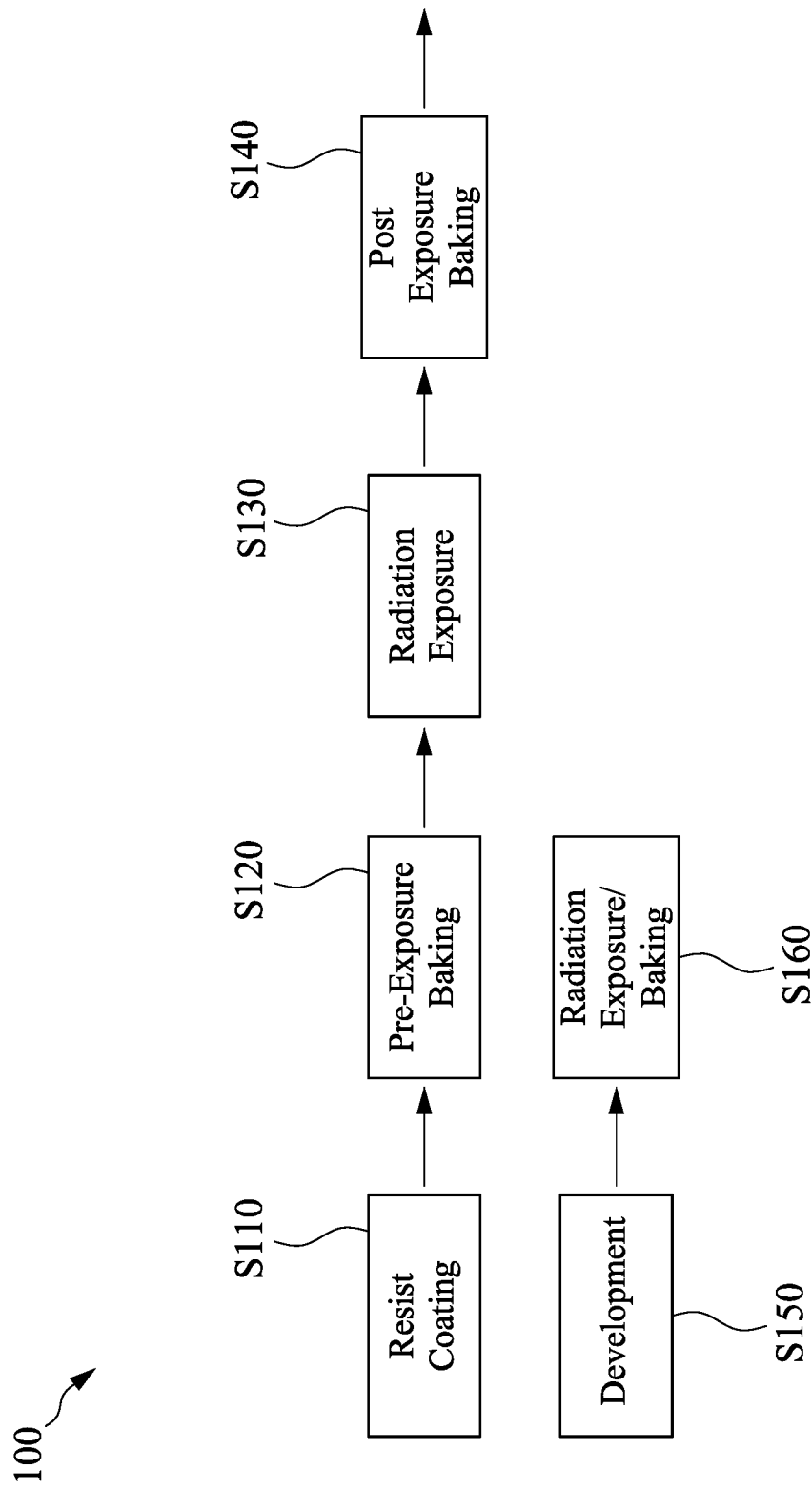
FIG. 1 illustrates a process flow of manufacturing a semiconductor device according to embodiments of the disclosure.
Figure 2:
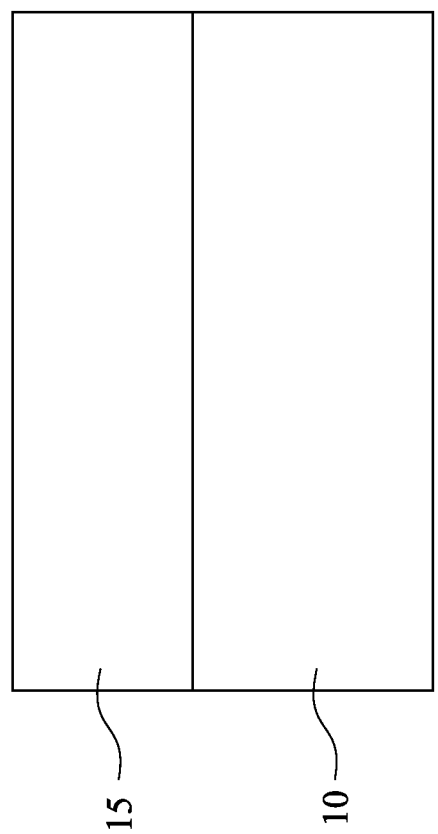
FIG. 2 shows a process stage of a sequential operation according to an embodiment of the disclosure.

FIG. 1 illustrates a process flow 100 of manufacturing a semiconductor device according to embodiments of the disclosure. A photoresist is coated on a surface of a layer to be patterned (target layer) or a substrate 10 in operation S110, in some embodiments, to form a photoresist layer 15, as shown in FIG. 2. Then the photoresist layer 15 undergoes a first baking operation S120 to evaporate solvents in the photoresist composition in some embodiments. The photoresist layer 15 is baked at a temperature and time sufficient to cure and dry the photoresist layer 15, also known as pre-exposure baking. In some embodiments, the photoresist layer is heated to a temperature of ranging from about 40° C. to about 120° C. for about 10 seconds to about 10 minutes.

After the first baking operation S120, the photoresist layer 15 is selectively exposed to actinic radiation 45/97 (see FIGS. 3A and 3B) in operation S130. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the radiation is an electron beam.

Figure 3A:
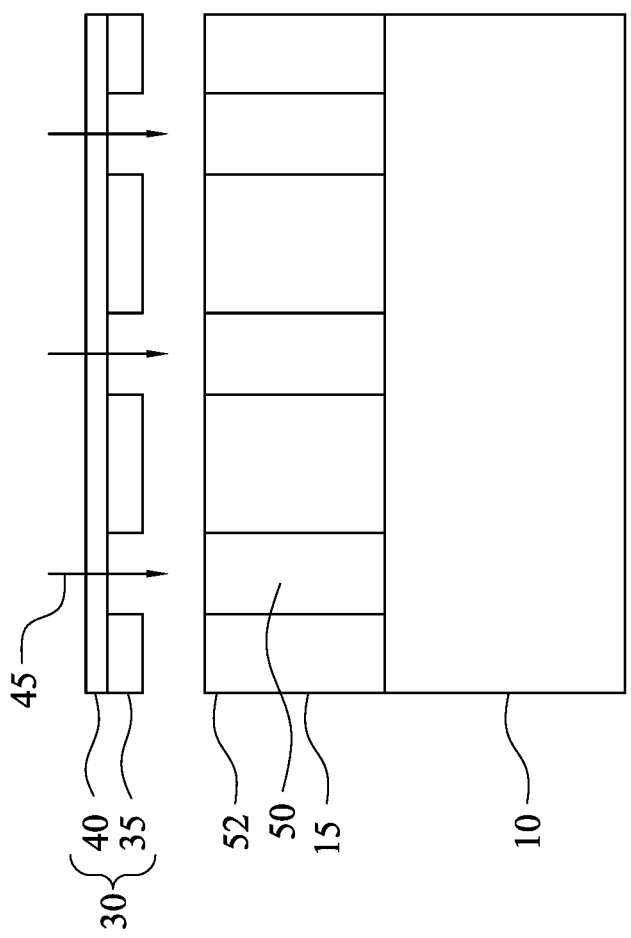
FIGS. 3A and 3B show a process stage of a sequential operation according to an embodiment of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
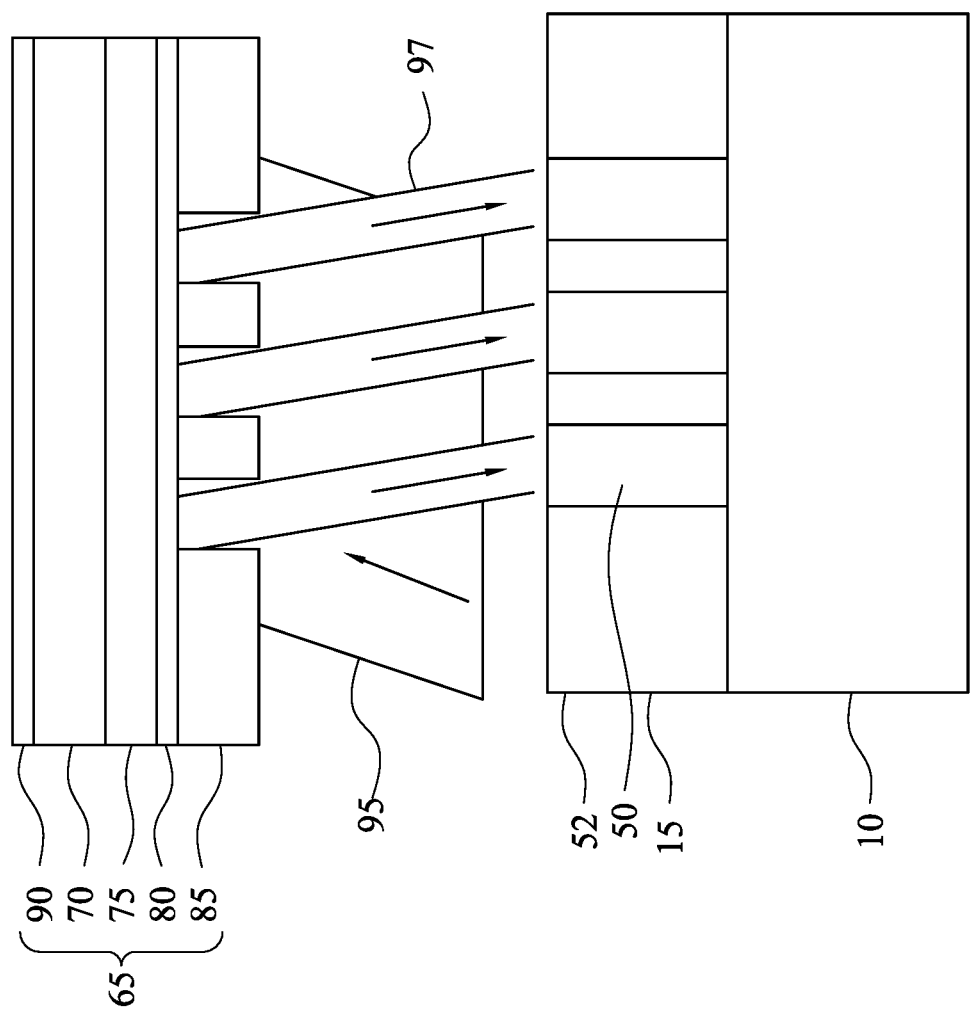

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

The region 50 of the photoresist layer exposed to radiation 45/97 undergoes a chemical reaction thereby changing its solubility in a subsequently applied developer relative to the region 52 of the photoresist layer not exposed to radiation. In some embodiments, the portion 50 of the photoresist layer exposed to radiation 45/97 undergoes a reaction making the exposed portion more soluble in a developer. In other embodiments, the portion 50 of the photoresist layer exposed to radiation 45/97 undergoes a crosslinking reaction making the exposed portion less soluble in a developer.

Next, the photoresist layer 15 undergoes a post-exposure bake in operation S140. In some embodiments, the photoresist layer 15 is heated to at a temperature ranging from about 50° C. to 160° C. for about 20 seconds to about 10 minutes. In some embodiments, the photoresist layer 15 is heated for about 30 seconds to about 5 minutes. In some embodiments, the photoresist layer 15 is heated for about 1 minute to about 2 minutes. The post-exposure baking may be used to assist in the generating, dispersing, and reacting of the acid/base/free radical generated from the impingement of the radiation 45/97 upon the photoresist layer 15 during the exposure. Such assistance helps to create or enhance chemical reactions that generate chemical differences between the exposed region 50 and the unexposed region 52 within the photoresist layer. These chemical differences also cause differences in the solubility between the exposed region 50 and the unexposed region 52.

Figure 5B:
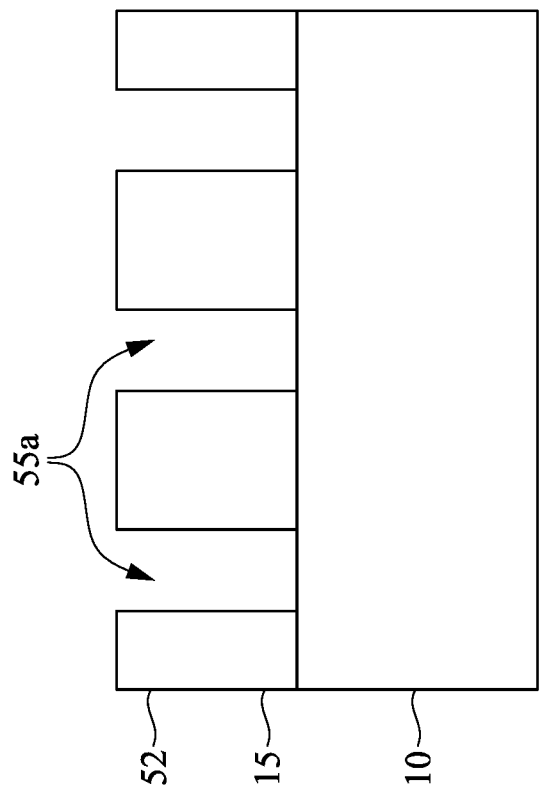
FIGS. 5A and 5B show a process stage of a sequential operation according to an embodiment of the disclosure.
Figure 5A:
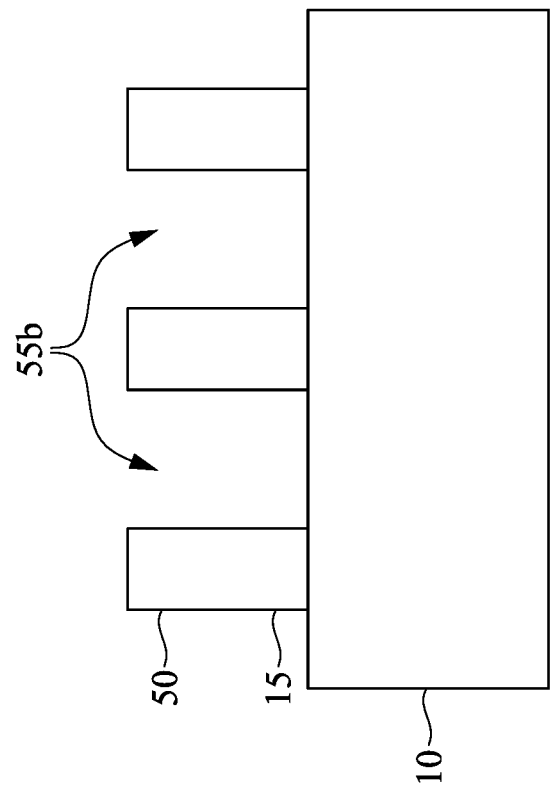

The selectively exposed photoresist layer is subsequently developed by applying a developer to the selectively exposed photoresist layer in operation S150. As shown in FIG. 4, a developer 57 is supplied from a dispenser 62 to the photoresist layer 15. In some embodiments, the exposed portion 50 of the photoresist layer is removed by the developer 57 forming a pattern of openings 55a in the photoresist layer 15 to expose the substrate 20, as shown in FIG. 5A. In other embodiments, the unexposed portion 52 of the photoresist layer is removed by the developer 57 forming a pattern of openings 55b in the photoresist layer 15 to expose the substrate 20, as shown in FIG. 5B.

In some embodiments, a second radiation exposure or a third baking operation S160 is performed to cause crosslinking of the patterned photoresist 50, 52.

Figure 6A:
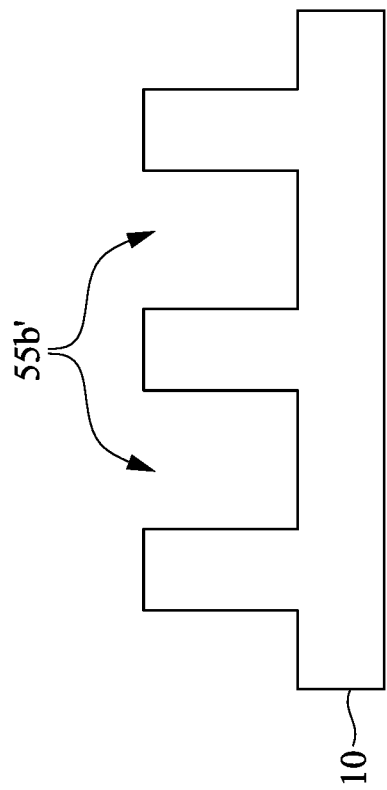
FIGS. 6A and 6B show a process stage of a sequential operation according to an embodiment of the disclosure.
Figure 6B:
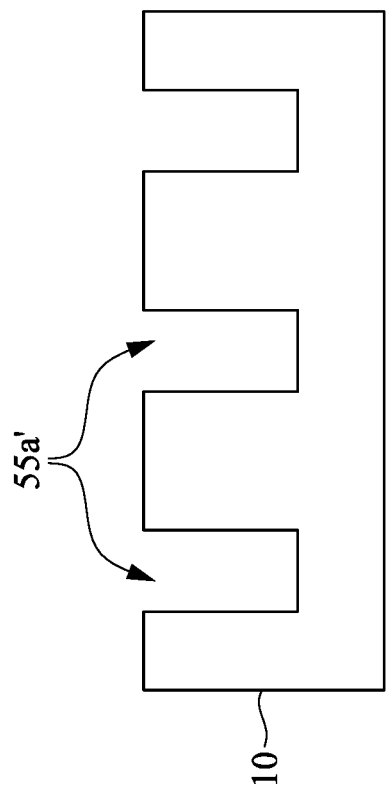

In some embodiments, the pattern of openings 55a, 55b in the photoresist layer 15 are extended into the target layer or substrate 10 to create a pattern of openings 55a', 55b' in the substrate 10, thereby transferring the pattern in the photoresist layer 15 into the substrate 10, as shown in FIGS. 6A and 6B. The pattern is extended into the substrate by etching, using one or more suitable etchants. The remaining photoresist of the photoresist pattern 50, 52 is at least partially removed during the etching operation in some embodiments. In other embodiments, the remaining photoresist of the photoresist pattern 50, 52 is removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, a silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent, such as n-butyl acetate (nBA). Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, the photoresist layer 15 includes a high sensitivity photoresist composition. In some embodiments, the high sensitivity photoresist composition is highly sensitive to extreme ultraviolet (EUV) radiation. In some embodiments, the photoresist composition includes a resin, and one or more photoactive compounds (PAC). In some embodiments, the photoactive compound is a photoacid generator (PAG) or a photoinitiator.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a thermally stable ligand, wherein the thermally stable ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of —$CF_3$, —SH, —OH, =O, S, P, $PO_2$, —C(=O)SH, —C(=O)OH, —C(=O)O—, —O—, —N—, —C(=O)NH, —$SO_2$OH, —$SO_2$SH, —SOH, and —$SO_2$—. In some embodiments, the ligand includes one or more substituents selected from the group consisting of —$CF_3$, —OH, —SH, and —C(=O) OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. % ligand, the organometallic photoresist does not function well. Above about 40 wt. % ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

Some embodiments of the photoresist include one or more photoactive compounds (PACs). The PACs are photoactive components, such as photoinitiators, photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments the PACs include free-radical generator photoinitiators, including n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxy acetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the PAC includes photobase generators and photo decomposable bases. In embodiments in which the PACs are photobase generators (PBG), the PBGs include quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

In some embodiments in which the PACs include photo decomposable bases (PBD), the PBDs include triphenylsulfonium hydroxide, triphenylsulfonium antimony hexafluoride, and triphenylsulfonium trifyl.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

Figure 7A:
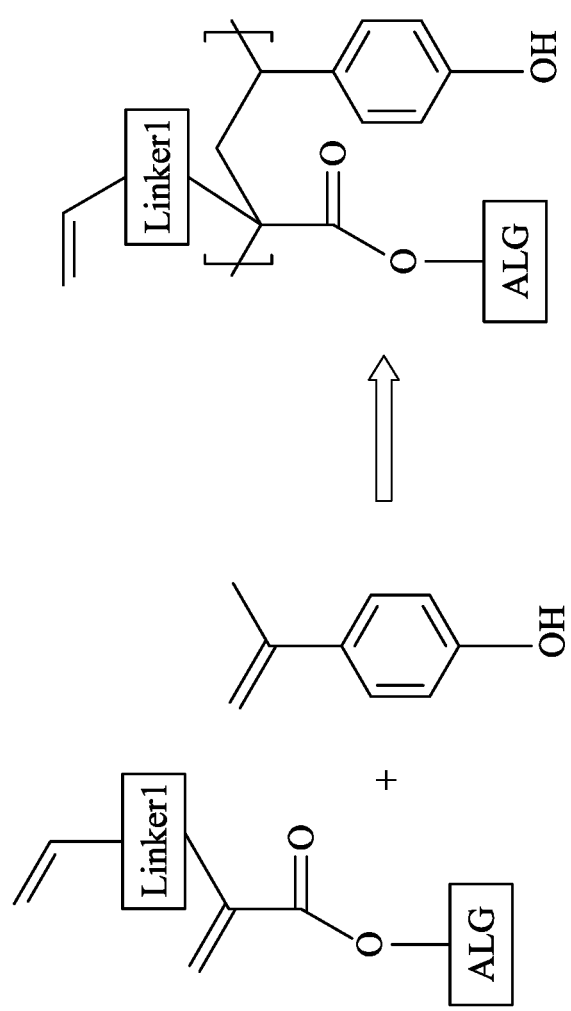
FIG. 7A shows the formation of resins according to some embodiments of the disclosure.

In some embodiments, the photoresist composition includes a resin along with one or more photoactive compounds (PACs). In some embodiments, the resin is a polymer or copolymer. In some embodiments, the resin is a copolymer of an acrylate monomer and a hydroxystyrene monomer. As shown in FIG. 7A, in some embodiments, the acrylate monomer including an acid labile group (ALG) and a radical-active functional group, such as an alkene or alkyne attached to the acrylate by a linker group (Linked), is copolymerized with a hydroxystyrene monomer. In some embodiments, the radical-active functional group is attached to the resin's polymer backbone via the linker group. The acid labile group (ALG) is a group that will decompose or be cleaved from the resin by a reaction with an acid.

In some embodiments, the resin includes one or more linker groups connecting the radical-active functional group to the polymer resin. The radical-active functional group is a group that is activated by a free radical and undergoes a crosslinking or polymerization reaction with other radical-active functional groups. In some embodiments, the one or more linker groups are one or more selected from the group consisting of a C1-C10 linear, branched, or cyclic alkyl group; a saturated or unsaturated C1-C10 linear, branched, or cyclic hydrocarbon group; and an electron-withdrawing group.

FIGS. 7B, 7C, 7D, 7E, and 7F show examples of monomer units containing an acid labile group and a linker group according to some embodiments of the disclosure. The acid labile groups are located on the lower part of the acrylate group, while the linker groups connect the terminal double bond to the upper part of the acrylate group, as shown in FIGS. 7B-7F. In some embodiments, the linker groups include an electron-withdrawing group, and the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group. In some embodiments, the halogen is fluorine, chlorine, bromine, or iodine.

Figure 7G:
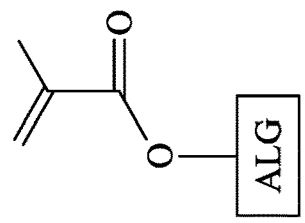
FIG. 7G shows a structure of a monomer unit containing an acid labile group according to some embodiments of the disclosure.
Figure 7O:
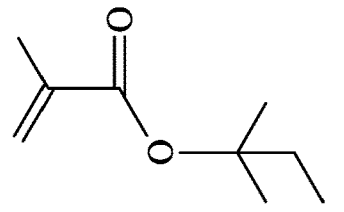
FIGS. 7H, 7I, 7J, 7K, 7L, 7M, 7N, and 7O show examples of monomer units containing an acid labile group according to some embodiments of the disclosure.
Figure 7N:
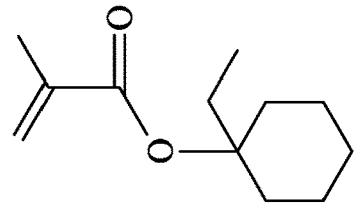
Figure 7M:
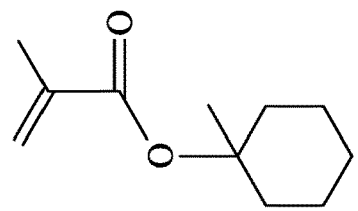
Figure 7L:
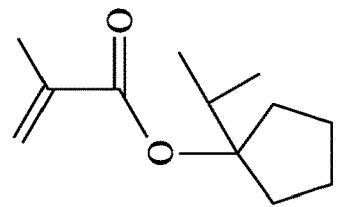
Figure 7K:
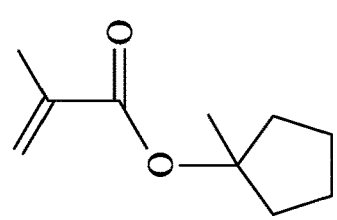
Figure 7J:
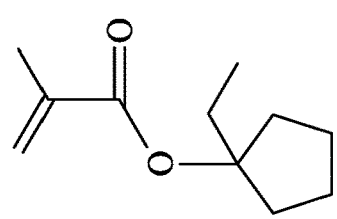
Figure 7I:
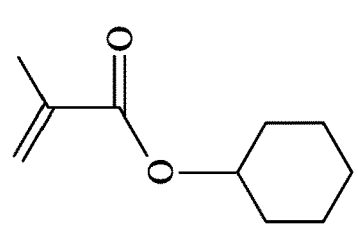
Figure 7H:
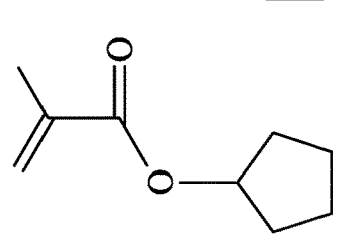

FIG. 7G shows a structure of an acrylate monomer unit containing an acid labile group (ALG) according to some embodiments of resin of the disclosure. FIGS. 7H, 7I, 7J, 7K, 7L, 7M, 7N, and 7O show examples of monomer units containing an acid labile group according to some embodiments of the disclosure. In some embodiments, the acid labile group is a C1-C20 linear, branched, or cyclic alkyl group. In some embodiments, the acid labile group is a cyclopentyl or cyclohexyl alkyl group as shown in FIGS. 7H-7N. In other embodiments, the acid labile group is a tertiary alkyl group, such as a t-butyl group or a t-pentyl group, as shown in FIG. 7O.

FIGS. 8A, 8B, 8C, and 8D show examples of linker groups having carbonyl groups and radical-active functional group substituents for resins according to some embodiments of the disclosure. R in FIGS. 8B and 8D is a C1-C10 linear, branched, or cyclic alkyl group in some embodiments. As shown in FIGS. 8A-8D, the radical-active functional group is an alkene group in these embodiments.

FIGS. 8E, 8F, 8G, 8H, 8I, 8J, 8K, 8L, 8M, 8N, and 8O show examples of electron-withdrawing groups and radical-active functional group substituents for resins according to some embodiments of the disclosure. In FIGS. 8E-8O, the electron withdrawing groups are alkyl groups substituted with a high electron affinity element, such as fluorine, and the radical-active functional groups are alkene groups.

Figure 9C:
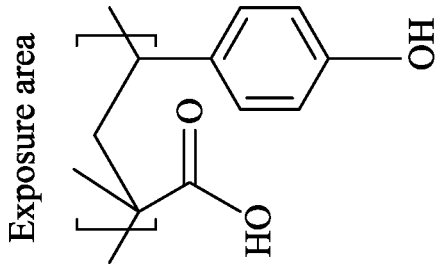
FIG. 9B shows a structure of a resin according to some embodiments of the disclosure that were not exposed to actinic radiation and FIG. 9C shows a structure of a resin according to some embodiments of the disclosure that were exposed to actinic radiation.
Figure 9B:
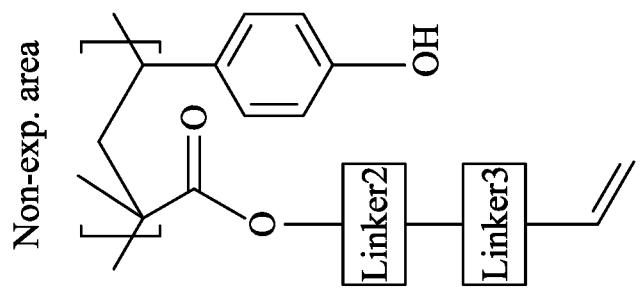
Figure 9A:
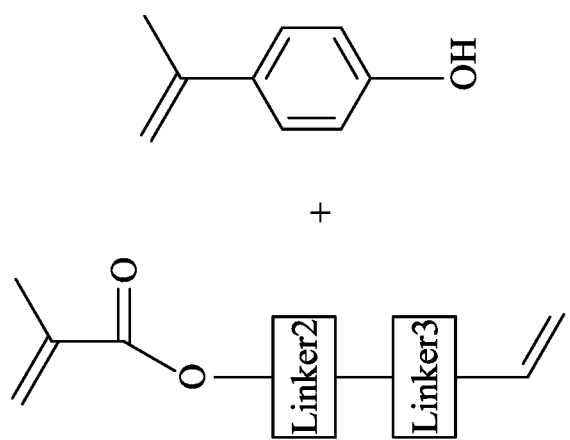
FIG. 9A shows monomer units of resins according to some embodiments of the disclosure.

In some embodiments, the radical-active functional group is attached to the acid labile group (ALG) of the resin. FIG. 9A shows monomer units of resins according to some embodiments of the disclosure. The monomer units in FIG. 9A copolymerize to form the copolymer resin shown in FIG. 9B. In some embodiments, the resin includes two linker groups (Linker2, Linker3) in the ALG linking the radical-active functional group to the ALG, as shown in FIGS. 9A and 9B. In some embodiments, upon selective (or pattern-wise) exposure to actinic radiation, the ALG including the two linker groups is cleaved from the resin, as shown in FIG. 9C, while the unexposed area of the resin remains intact, as shown in FIG. 9B. The formation of a carboxyl group in the exposed area renders the exposed area more soluble in an aqueous-based developer, such as a tetramethylammonium hydroxide solution.

In some embodiments, the linker group (Linker2) closer to the ester bond functions to adjust the activation energy (Ea) of the acid labile group, while the linker group (Linker3) closer to the radical-active functional group (the alkenyl group) functions to adjust the glass transition temperature $T_g$ of the resin and the reactivity of the radical-active functional group. In some embodiments, the linker group (Linker3) closer to the radical-active functional group increases the $T_g$ and increases the reactivity of the radical-active functional group. In some embodiments, the linker group (Linker2) closer to the ester bond is a C1-C10 saturated or unsaturated linear, branched, or cyclic hydrocarbon group. In some embodiments, the linker group (Linker3) closer to the radical-active functional group is a C1-C10 saturated or unsaturated linear, branched, or cyclic hydrocarbon group or an electron-withdrawing group. In some embodiments, the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group.

Figure 9S:
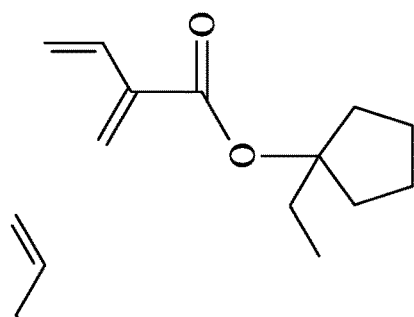
Figure 9R:
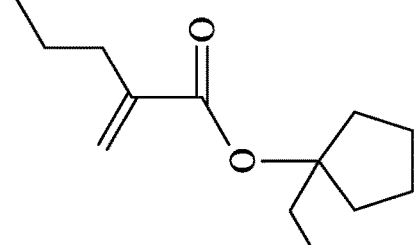
Figure 9Q:
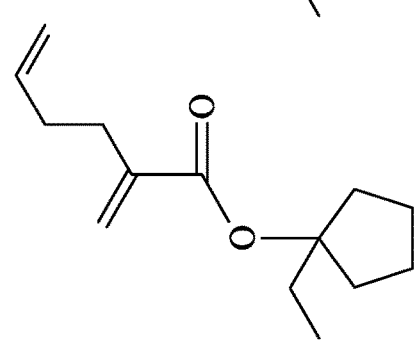
Figure 9P:
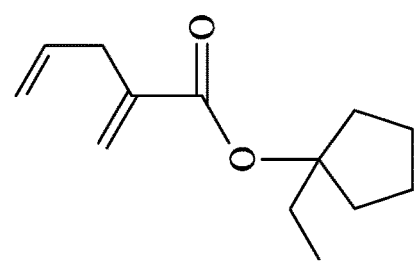
Figure 9O:
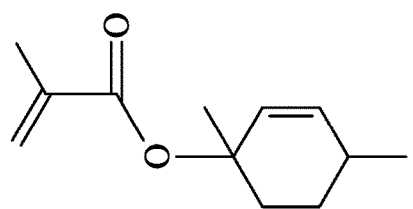
Figure 9N:
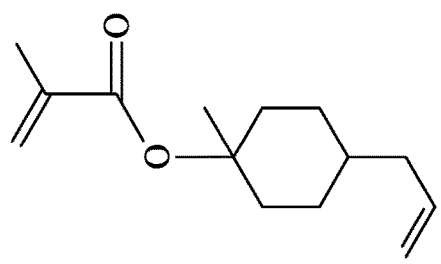
Figure 9M:
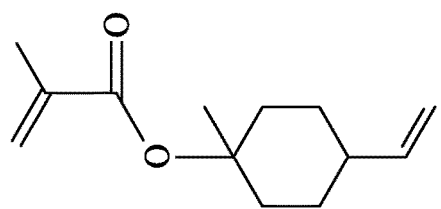
Figure 9L:
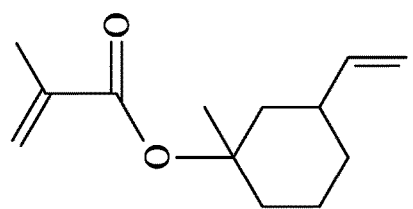

FIGS. 9D, 9E, 9F, 9G, 9H, 9I, 9J, 9K, 9L, 9M, 9N, 9O, 9P, 9Q, 9R, and 9S show examples of resin monomer units having one or two linker groups according to some embodiments of the disclosure. In some embodiments, one or more linker groups form an acid labile group, as shown in FIGS. 9D-9S. In some embodiments, the linker group closer to the ester bond is a cyclic alkyl group, as shown in FIGS. 9D-9N and 9P-9S, and in other embodiments, the linker group closer to the ester bond is a cyclic alkenyl group, as shown in FIG. 9O. In some embodiments, the cyclic alkyl groups are substituted with alkyl groups, such as a methyl group (FIGS. 9D, 9F, 9G, and 9J-9O), an ethyl group (FIG. 9E), or an isopropyl group (FIGS. 9H and 9I). In some embodiments, the linker group closer to the radical-active functional group is a cyclic alkyl group (FIG. 9G), a carbonyl group (FIG. 9H), a carboxyl group (FIG. 9I), an alkenyl group (FIG. 9J), or a linear or branched alkyl group (FIGS. 9F, 9K, and 9N). In some embodiments, the resin includes acrylate monomer units with an ALG attached to the ester bond and a radical-active functional group attached to the resin's polymer backbone via a linker group, as shown in FIGS. 9P-9S.

In some embodiments, the resin includes a sensitizer group, a radical-active functional group, and a linker group connecting the radical-active functional group to the sensitizer group. In some embodiments, the sensitizer group is a C1-C18 substituted or unsubstituted aryl group. In some embodiments, the aryl group is a phenyl group, a naphthalenyl group, or an anthracenyl group. In some embodiments, the C1-C18 substituted or unsubstituted aryl group includes an —OH group substituent. In some embodiments, the linker group is selected from the group consisting of a C1-C10 saturated or unsaturated linear, branched, or cyclic hydrocarbon group and an electron-withdrawing group. In some embodiments, the linker group adjusts the activation energy (Ea) of the radical-active functional group and increases the $T_g$ of the resin.

Figure 10B:
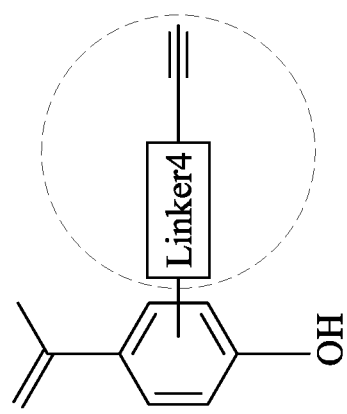
FIGS. 10A and 10B show structures of monomer units having radical-active functional groups attached to sensitizer groups according to some embodiments of the disclosure.
Figure 10A:
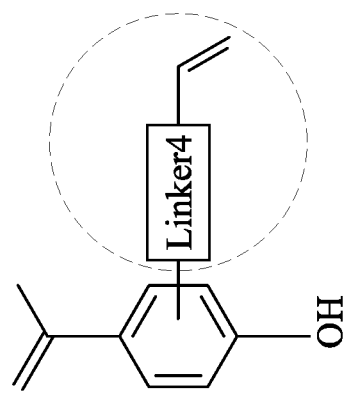
Figure 10C:
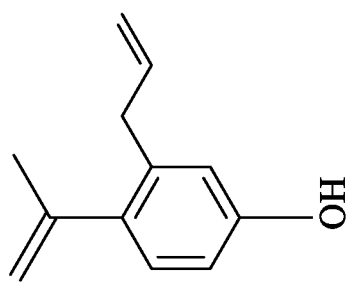
FIGS. 10C, 10D, 10E, 10F, 10G, and 10H show examples of monomer units having radical-active functional groups attached to sensitizer groups according to some embodiments of the disclosure.
Figure 10D:
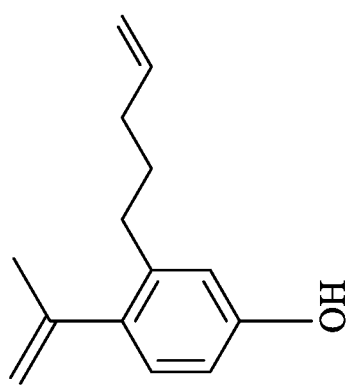
Figure 10E:
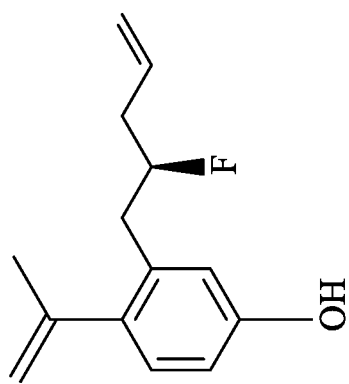
Figure 10F:
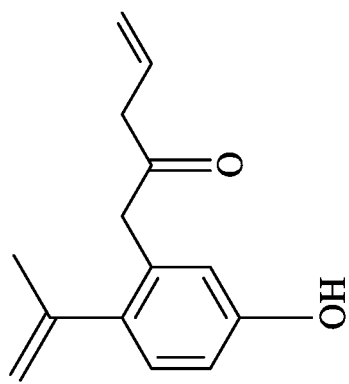
Figure 10G:
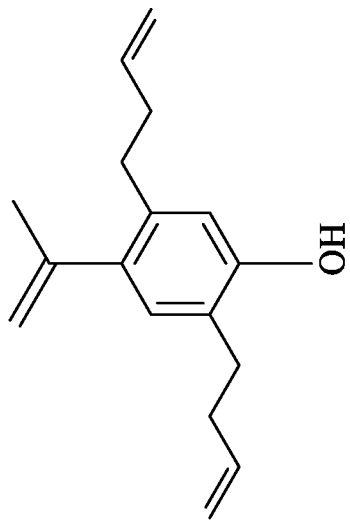
Figure 10H:
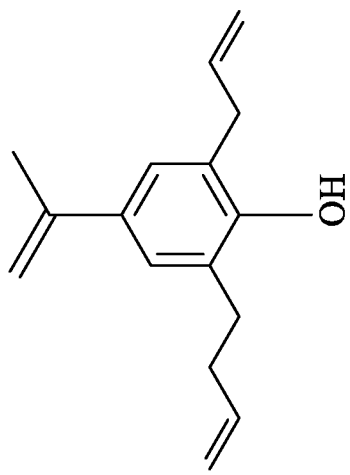

FIGS. 10A and 10B show structures of monomer units of the resin having radical-active functional groups attached to sensitizer groups via a linker group (Linker4) according to some embodiments of the disclosure. The resin monomer unit of FIG. 10A has an alkenyl radical-active functional group, while the resin monomer unit of FIG. 10B has an alkynyl radical-active functional group. FIGS. 10C, 10D, 10E, 10F, 10G, and 10H show examples of monomer units having radical-active functional groups attached to sensitizer groups according to some embodiments of the disclosure. The resin monomer units of the embodiments of FIGS. 10A-10H are substituted hydroxystyrenes, however, the resin is not limited to substituted hydroxystyrene monomer units. The hydroxystyrene monomer units may have 1 to 4 radical-active functional groups attached to the sensitizer group. In some embodiments, the radical-active functional groups are attached to the sensitizer group at the ortho or meta position relative to the hydroxyl group. In some embodiments, one radical-active functional group is attached at the ortho position while another radical-active functional group is attached at the meta position (FIG. 10G). In other embodiments, there are two radical-active functional groups at the meta positions, or two radical-active functional groups at the ortho positions (FIG. 10H). In some embodiments, the linker group is an electron-withdrawing group, as shown in FIGS. 10E and 10F. The electron-withdrawing groups can be any of the electron-withdrawing groups disclosed herein.

Figure 11:
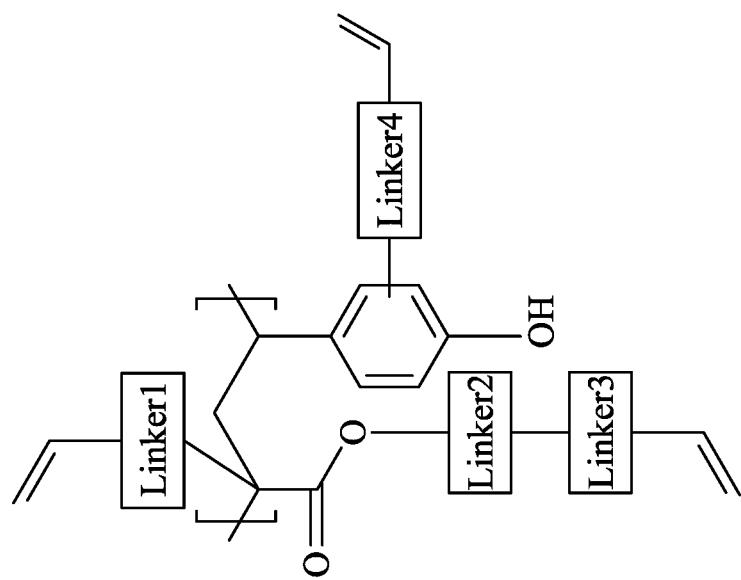
FIG. 11 shows a structure of a monomer unit of a resin according to some embodiments of the disclosure.
Figure 12:
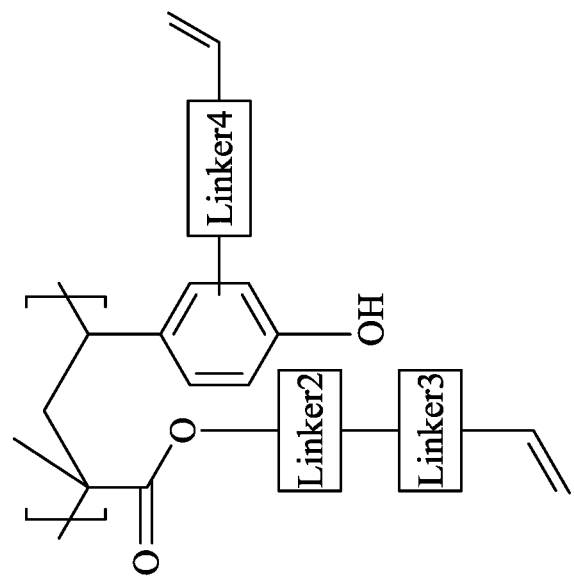
FIG. 12 shows a structure of a monomer unit of a resin according to some embodiments of the disclosure.
Figure 13:
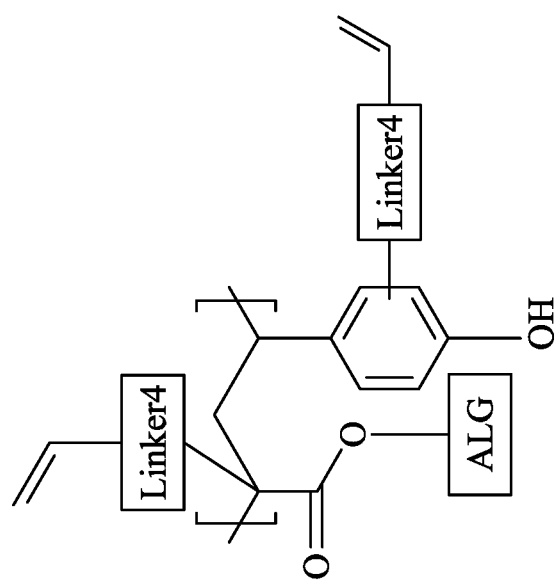
FIG. 13 shows a structure of a monomer unit of a resin according to some embodiments of the disclosure.

In some embodiments, the resin includes a radical-active functional group attached to the resin polymer backbone via a linker group (Linked), a monomer unit with an ALG including one or two different linker groups (Linker2, Linker3) and a second radical-active functional group attached to the ALG, and a monomer unit with a sensitizer group having a third radical-active functional group attached to the sensitizer group via a linker group (Linker4), as shown in FIG. 11. In another embodiment, the resin includes a monomer unit with an ALG including one or two different linker groups (Linker2, Linker3) and a radical-active functional group attached to the ALG, and a monomer unit with a sensitizer group with a second radical-active functional group attached to the sensitizer group via a linker group (Linker4), as shown in FIG. 12. In another embodiment, the resin includes a radical-active functional group attached to the resin polymer backbone via a linker group (Linked), a monomer unit with an ALG, and a monomer unit with a sensitizer group having a second radical-active functional group attached to the sensitizer group via a linker group (Linker4), as shown in FIG. 13. The linker groups and ALGs can be any of the linker groups or ALGs disclosed herein.

In some embodiments, the resin has a weight average molecular weight ranging from about 500 to about 1,000,000. In some embodiments, the resin has a weight average molecular weight ranging from about 2,000 to about 250,000.

In some embodiments, the resin structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, hydroxystyrenes, vinyl ethers, combinations of these, or the like.

Specific structures that are utilized for repeating units of the resin structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, hydroxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating units of resin also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

In some embodiments, the resin also includes other groups attached to the polymer structure that help to improve a variety of properties of the resin. For example, inclusion of a lactone group to the resin structure assists in reducing the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, a cross-linking agent is added to the photoresist. The cross-linking agent reacts with one group from one of the hydrocarbon structures in the resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In other embodiments the cross-linking agent has the following structure:

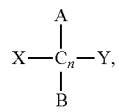

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

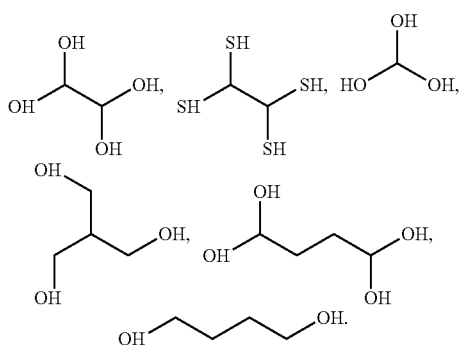

Alternatively, instead of or in addition to the cross-linking agent being added to the photoresist composition, a coupling reagent is added in some embodiments. The coupling reagent assists the cross-linking reaction by reacting with the groups on the hydrocarbon structure in the resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the resin.

Alternatively, in some embodiments in which the coupling reagent is added to the photoresist without the cross-linking agent, the coupling reagent is used to couple one group from one of the hydrocarbon structures in the polymer to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

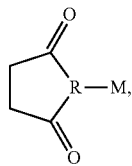

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR, —SO$_2$N(R*)$_2$; —SO$_2$R*; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

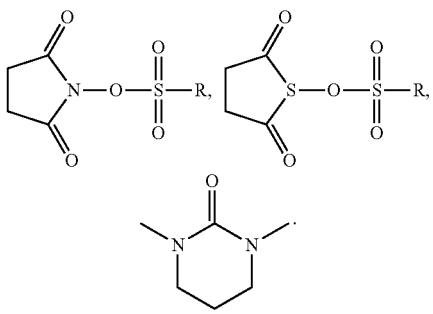

The individual components of the photoresist are placed into a solvent in order to aid in the mixing and dispensing of the photoresist. To aid in the mixing and dispensing of the photoresist, the solvent is chosen at least in part based upon the materials chosen for the resin as well as the PACs. In some embodiments, the solvent is chosen such that the resin and the PACs can be evenly dissolved into the solvent and dispensed upon the layer to be patterned.

A quencher is added to some embodiments of the photoresist composition to inhibit diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof, including its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof, including its esters, such as phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and arylammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment, bile-salt esters may be used as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2',4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and T-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent, such as a carboxyl group, a methacryloyl group, an isocyanate group, or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxy silane, 3-mercaptopropyltrimethoxysilane, 3-mercaptopropyltriethoxy silane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

The photoresist composition includes a solvent in some embodiments. The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the resin and the PACs, along with any desired additives or other agents, are added to the solvent for application. Once added, the mixture is then mixed in order to achieve a homogenous composition throughout the photoresist composition to ensure that there are no defects caused by uneven mixing or nonhomogenous composition of the photoresist. Once mixed together, the photoresist may either be stored prior to its usage or used immediately.

Once ready, the photoresist composition is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-exposure bake of the photoresist layer 15 is performed in some embodiments to cure and dry the photoresist prior to radiation exposure (see FIG. 1, operation S120). The curing and drying of the photoresist layer 15 removes the solvent component while leaving behind the resin, the PACs, and the other chosen additives. In some embodiments, the pre-exposure baking is performed at a temperature suitable to evaporate the solvent, such as between about 40° C. and 120° C., although the precise temperature depends upon the materials chosen for the photoresist composition. The pre-baking is performed for a time sufficient to cure and dry the photoresist layer, such as between about 10 seconds to about 10 minutes.

FIGS. 3A and 3B illustrate selective exposure or patternwise exposure of the photoresist layer to form an exposed region 50 and an unexposed region 52. In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45/97, such as ultraviolet light, to the photoresist layer 15 to induce a reaction of the sensitizers and PACs to generate acids, which in turn react with the polymer to chemically alter those regions of the photoresist layer to which the radiation 45/97 impinges. In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beam, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 45/97 is extreme ultraviolet light having a 13.5 nm wavelength, the PAC includes a photoacid generator, and the group to be decomposed is an ester group on the polymer resin structure. The patterned radiation 45/97 impinges upon the photoacid generator. The photoacid generator absorb the impinging patterned radiation 45/97. This absorption initiates the photoacid generator to generate a proton (e.g., a $H^+$ ion) within the photoresist layer 15.

In some embodiments, the proton impacts an ester group with an acid labile group. The groups to be removed (the acid labile groups) are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a crosslinking reaction may occur between two separate de-protected polymers that have undergone the de-protecting reaction and crosslinker or crosslinking groups in the photoresist composition. In particular, hydrogen atoms within the carboxylic groups formed by the de-protecting reaction are removed and the oxygen atoms react with and bond with the crosslinker or the crosslinking group. This bonding of the crosslinker or crosslinking group to two polymers bonds the two polymers to each other through the crosslinker or crosslinking group, thereby forming a cross-linked polymer. By increasing the molecular weight of the polymers through the cross-linking reaction, the new cross-linked polymer becomes less soluble in organic solvent negative resist developers.

In other embodiments, where the photoresist is a positive tone resist, the proton released by the photoacid generator reacts with the acid-labile group causing decomposition of the acid-labile group and replacement of the acid-labile group with a hydroxyl group, thereby changing the solubility of the exposed regions of the photoresist layer. For example, the formation of hydroxyl groups makes the polymer more soluble in aqueous-based developers, such as TMAH-based developers, in some embodiments.

In some embodiments, the photoactive compound includes a photoinitiator that produces free radicals when exposed to actinic radiation, such as ultraviolet radiation having a wavelength of about 365 nm or less. The free radicals produced by the exposed photoinitiator causes the radical-active functional groups on adjacent resin polymer chains to react and crosslink in some embodiments. In some embodiments, the photoactive compound (PAC) in the photoresist composition includes a two or more PACS, including a photoacid generator and a free-radical producing photoinitiator. Exposure to actinic radiation causes the photoacid generator to generate an acid to cleave the ALGs on the resin and the photoinitiator to generate free radicals to cause the radical-active functional groups to crosslink. In some embodiments, the photoresist is exposed to two different wavelengths of ultraviolet radiation, one wavelength to activate the photoacid generator and a second wavelength to activate the free-radical producing photoinitiator.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45/97, a post-exposure baking is performed in some embodiments to assist in the generating, dispersing, and reacting of the acid generated from the impingement of the radiation 45/97 upon the PACs during the exposure (see FIG. 1, operation S140). Such thermal assistance helps to create or enhance chemical reactions that generate chemical differences between the exposed region 50 and the unexposed region 52 within the photoresist layer 15. These chemical differences also cause differences in the solubility between the exposed region 50 and the unexposed region 52. In some embodiments, the post-exposure baking occurs at temperatures ranging from about 50° C. to about 160° C. for a period of between about 20 seconds and about 10 minutes.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-exposed regions 50 of a positive tone photoresist composition in some embodiments, exposing the surface of the substrate 10, as shown in FIG. 5A, and leaving behind well-defined unexposed photoresist regions 52, having improved definition than provided by conventional photoresist photolithography. In other embodiments, the developer 57 dissolves the radiation-unexposed regions 52 of a negative tone photoresist composition exposing the surface of the substrate 10, as shown in FIG. 5B, and leaving behind well-defined exposed photoresist regions 50, having improved definition than provided by conventional photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the photoresist pattern 55a, 55b is in place. For example, in some embodiments, an additional exposure to ultraviolet radiation having a wavelength of less than about 365 nm or a third baking operation at a temperature of about 100° C. to about 250° C. (S160) is performed to crosslink or further crosslink the radical-active functional groups on the resin polymer chains.

In some embodiments, an etching operation, using dry or wet etching, is performed in some embodiments, to transfer the pattern 55a, 55b of the photoresist layer to the underlying substrate 10, forming recesses 55a', 55b' as shown in FIGS. 6A and 6B. The substrate 10 has a different etch resistance than the photoresist layer 15. In some embodiments, the etchant is more selective to the substrate 10 than the photoresist layer 15. The crosslinked resin according to embodiments of the disclosure prevent photoresist pattern collapse and provide increased resistance to etching operations.

Figure 14:
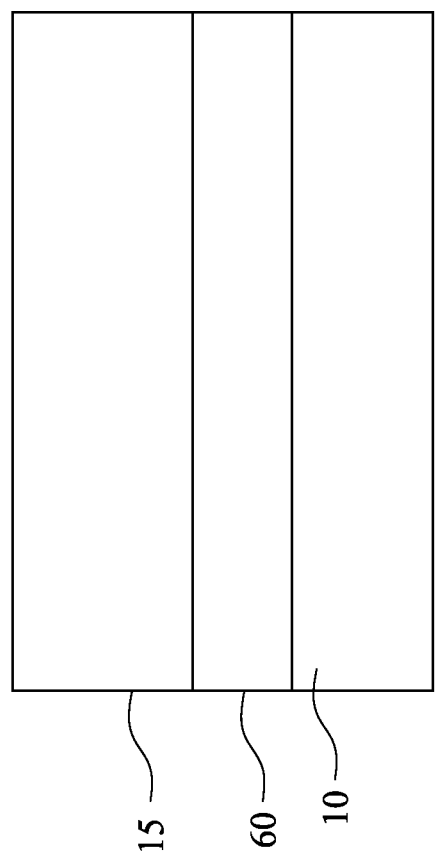
FIG. 14 shows a process stage of a sequential operation according to an embodiment of the disclosure.

In some embodiments, a target layer 60 is disposed over the substrate prior to forming the photoresist layer, as shown in FIG. 14. In some embodiments, the target layer 60 is a metallization layer or a dielectric layer, such as a passivation layer, disposed over a metallization layer. In embodiments where the target layer 60 is a metallization layer, the target layer 60 is formed of a conductive material using metallization processes, and metal deposition techniques, including chemical vapor deposition, atomic layer deposition, and physical vapor deposition (sputtering). Likewise, if the target layer 60 is a dielectric layer, the target layer 60 is formed by dielectric layer formation techniques, including thermal oxidation, chemical vapor deposition, atomic layer deposition, and physical vapor deposition.

Figure 15A:
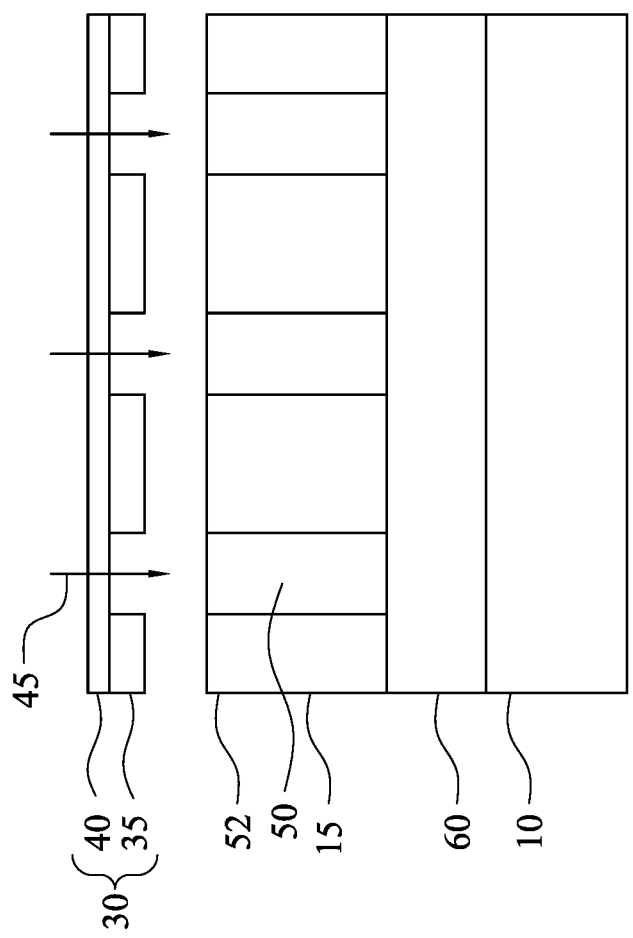
FIGS. 15A and 15B show a process stage of a sequential operation according to an embodiment of the disclosure.
Figure 15B:
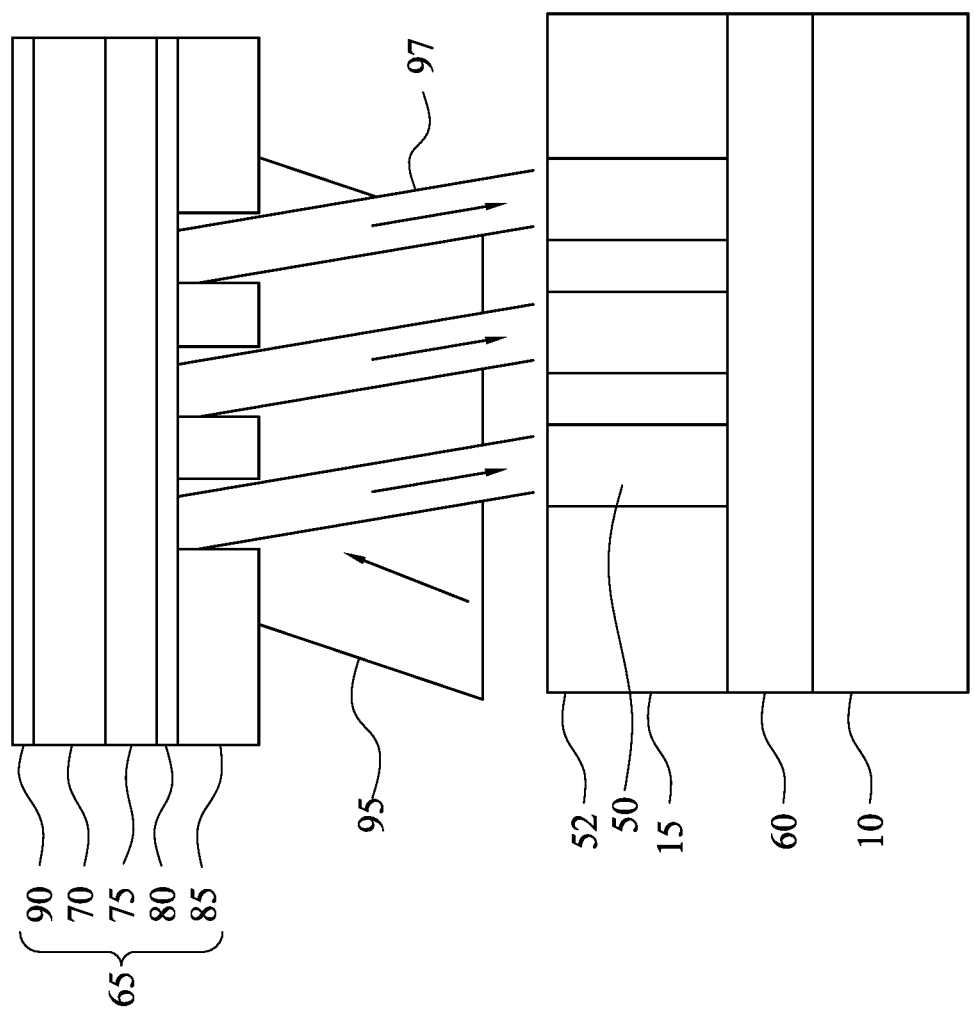

The photoresist layer 15 is subsequently selectively exposed or patternwise exposed to actinic radiation 45 to form exposed regions 50 and unexposed regions 52 in the photoresist layer, as shown in FIGS. 15A and 15B, and described herein in relation to FIGS. 3A and 3B.

Figure 16:
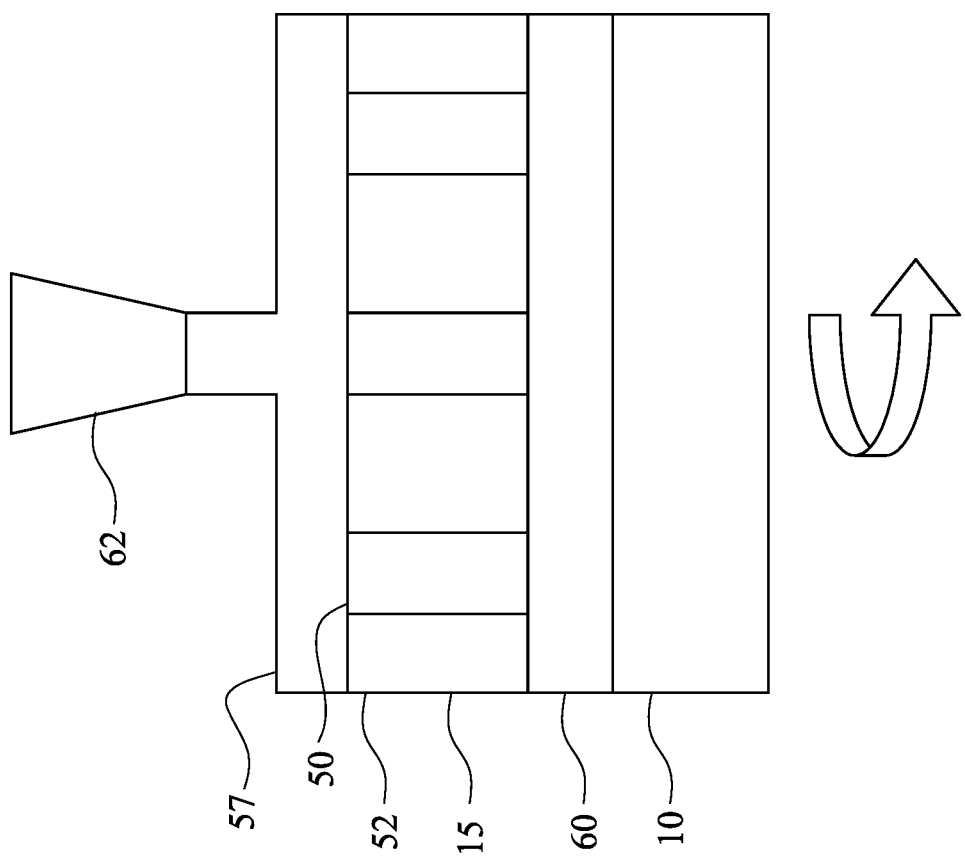
FIG. 16 shows a process stage of a sequential operation according to an embodiment of the disclosure.
Figure 17B:
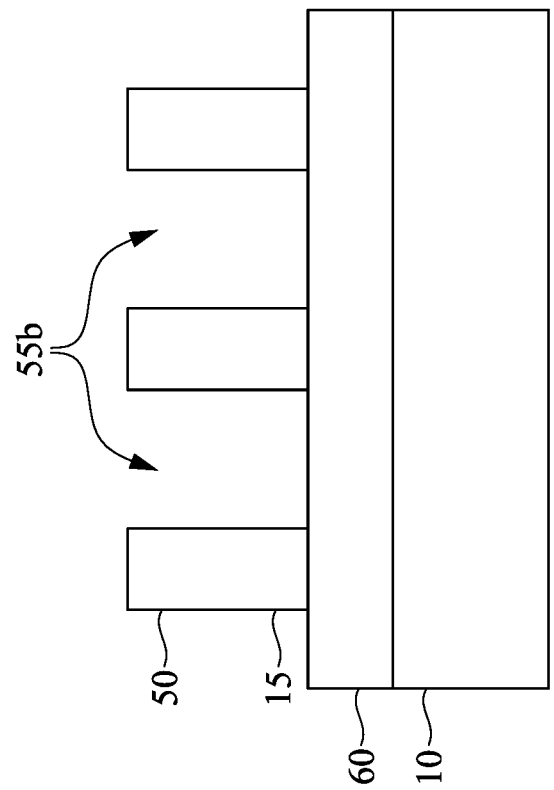
FIGS. 17A and 17B show a process stage of a sequential operation according to an embodiment of the disclosure.
Figure 17A:
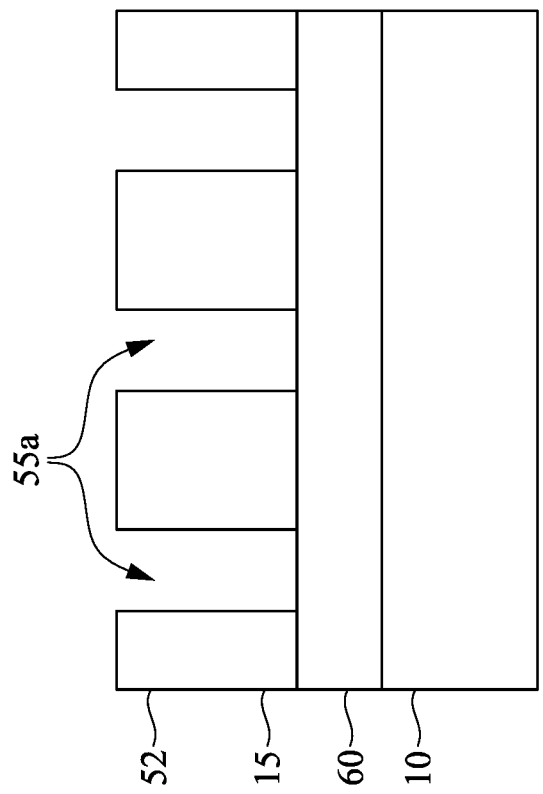

As shown in FIG. 16, the selectively exposed or patternwise exposed photoresist layer 15 is developed by dispensing developer 57 from a dispenser 62 to form a pattern of photoresist openings 55a, 55b, as shown in FIGS. 17A and 17B. FIG. 17A illustrates the development of a positive tone photoresist, and FIG. 17B illustrates the development of a negative tone photoresist. The development operation is similar to that explained with reference to FIGS. 4, 5A, and 5B, herein.

Figure 18B:
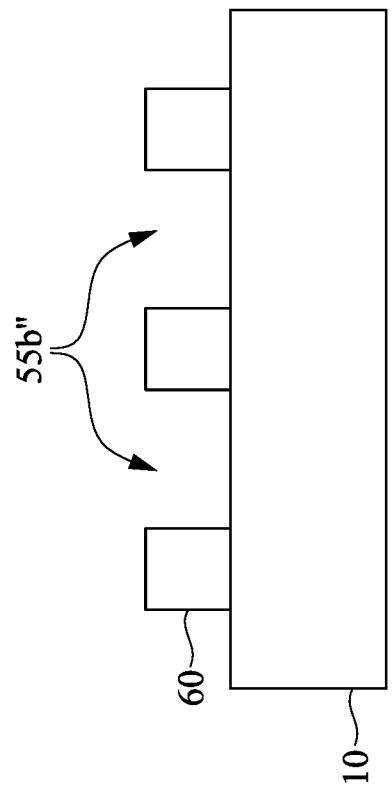
FIGS. 18A and 18B show a process stage of a sequential operation according to an embodiment of the disclosure.
Figure 18A:
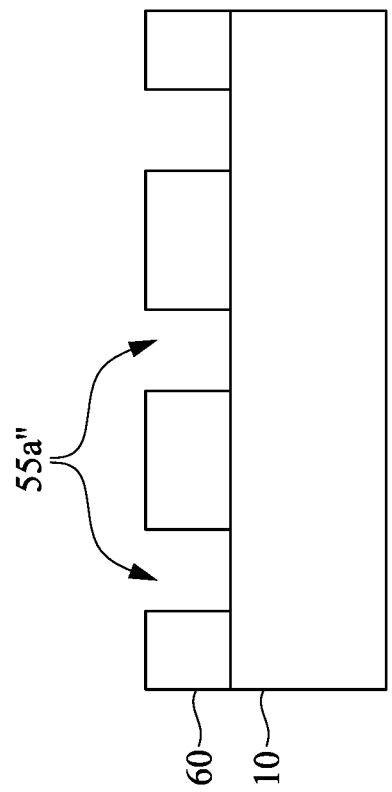

Then, as shown in FIGS. 18A and 18B, the pattern 55a, 55b in the photoresist layer 15 is transferred to the target layer 60 using an etching operation and the photoresist layer is removed, as explained with reference to FIGS. 6A and 6B to form pattern 55a", 55b" in the target layer 60.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

The novel resins, photoresist compositions, and methods according to the present disclosure provide higher semiconductor device feature resolution and density at higher wafer exposure throughput with reduced defects in a higher efficiency process than conventional photoresist compositions and exposure techniques. The novel resins, photoresist compositions, and methods prevent high aspect ratio photoresist pattern collapse and breaking, and increased etching resistance. Embodiments of the disclosure provide improved line width roughness and line edge roughness. Embodiments of the disclosure provide improved semiconductor device yield in extreme ultraviolet lithography operations.

An embodiment of disclosure is a method for manufacturing a semiconductor device, including forming a photoresist layer including a photoresist composition over a substrate. The photoresist layer is selectively exposed to actinic radiation to form a latent pattern and the latent pattern is developed by applying a developer to the selectively exposed photoresist layer to form a patterned photoresist. The photoresist composition includes a photoactive compound and a resin comprising a radical-active functional group and an acid labile group. In an embodiment, the method includes heating the photoresist layer after the selectively exposing the photoresist layer to actinic radiation and before the developing the latent pattern. In an embodiment, the method includes exposing the patterned photoresist to ultraviolet radiation having a wavelength 365 nm or less or heating the patterned photoresist after the developing the latent pattern. In an embodiment, the method includes removing a portion of the substrate exposed by the patterned photoresist. In an embodiment, the resin includes one or more linker groups connecting the radical-active functional group to the resin. In an embodiment, the one or more linker groups are one or more selected from the group consisting of a C1-C10 saturated or unsaturated linear, branched, or cyclic alkyl group and an electron-withdrawing group. In an embodiment, the linker groups include an electron-withdrawing group, and the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group. In an embodiment, the acid labile group is a C1-C20 linear, branched, or cyclic alkyl group. In an embodiment, the radical-active functional group is attached to the acid labile group. In an embodiment, the resin includes hydroxystyrene monomer units. In an embodiment, the radical-active functional group is an alkene group or an alkyne group.

Another embodiment of the disclosure is a photoresist composition, including a photoactive compound and a resin including a radical-active functional group and an acid labile group. In an embodiment, the photoactive compound comprises one or more free radical photoinitiators or photoacid generators. In an embodiment, the resin includes one or more linker groups connecting the radical-active functional group to the resin, and the one or more linker groups are one or more selected from the group consisting of a C1-C10 linear, branched, or cyclic alkyl group; a saturated or unsaturated C1-10 linear, branched, or cyclic hydrocarbon group; and an electron-withdrawing group. In an embodiment, the one or more linker groups include an electron-withdrawing group, and the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group. In an embodiment, the acid labile group is a C1-C20 linear, branched, or cyclic alkyl group. In an embodiment, the radical-active functional group is attached to the acid labile group. In an embodiment, the resin includes one or more sensitizer groups. In an embodiment, the one or more sensitizer groups include C1-C18 substituted or unsubstituted aryl groups. In an embodiment, the C1-C18 substituted or unsubstituted aryl groups include an —OH group substituent. In an embodiment, the resin includes hydroxystyrene monomer units.

Another embodiment of the disclosure is a resin, including monomer units having a radical-active functional group and an acid labile group. The radical-active functional group is an alkene group or an alkyne group. In an embodiment, the resin includes one or more linker groups connecting the radical-active functional group to the resin. In an embodiment, the one or more linker groups are one or more selected from the group consisting of a C1-C10 linear, branched, or cyclic alkyl group; a saturated or unsaturated C1-C10 linear, branched, or cyclic hydrocarbon group; and an electron-withdrawing group. In an embodiment, the linker groups include an electron-withdrawing group, and the electron-withdrawing groups is a carboxyl group, or a C1-C10 alkyl group substituted with one or more substituents selected from the group consisting of a halogen, a carbonyl group, a sulfonyl group, a nitro group, an ammonium group and a cyano group. In an embodiment, the acid labile group is a C1-C20 linear, branched, or cyclic alkyl group. In an embodiment, the radical-active functional group is attached to the acid labile group. In an embodiment, the resin includes one or more sensitizer groups. In an embodiment, the one or more sensitizer groups include C1-C18 substituted or unsubstituted aryl groups. In an embodiment, the C1-C18 substituted or unsubstituted aryl groups include an —OH group substituent. In an embodiment, the resin includes hydroxystyrene monomer units.

Another embodiment of the disclosure is a method for manufacturing a semiconductor device, including forming a photoresist layer comprising a photoresist composition over a substrate. The photoresist layer is patternwise exposed to actinic radiation. The patternwise exposed photoresist layer is developed by applying a developer to the patternwise exposed photoresist layer to form a pattern. The photoresist composition includes a photoactive compound and a resin including a radical-active functional group and an acid labile group. The radical-active functional group is an alkene group or an alkyne group. In an embodiment, the radical-active functional group is attached to the acid labile group. In an embodiment, the resin includes hydroxystyrene monomer units. In an embodiment, the resin includes a sensitizer group. In an embodiment, the radical-active functional group is connected to the sensitizer group by a linker group. In an embodiment, the resin comprises one or more monomer units selected from the group consisting of

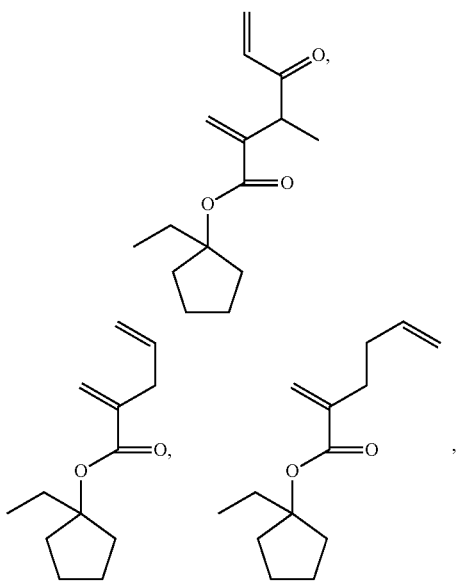

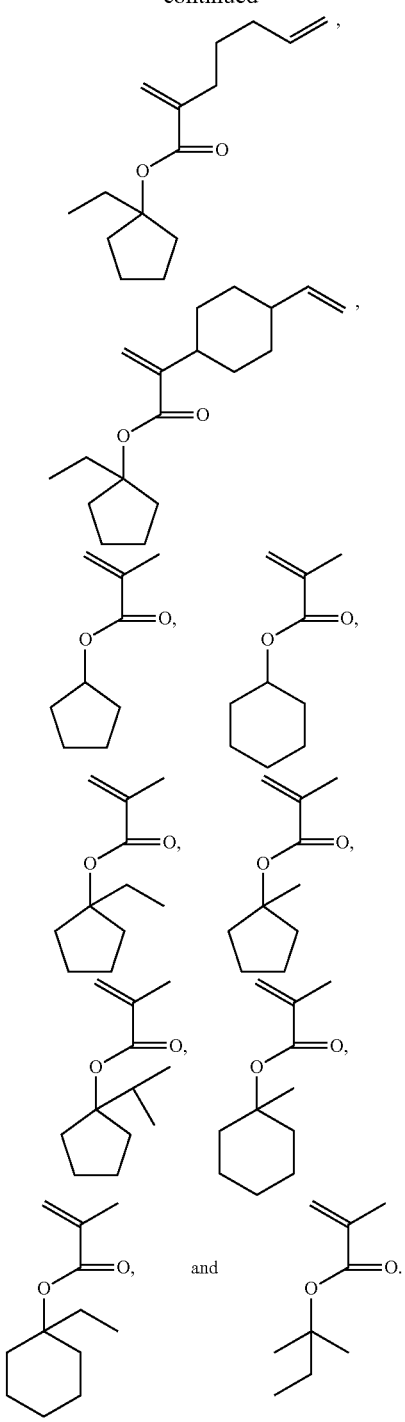

In an embodiment, the resin includes one or more linker groups connecting the radical-active functional group to the resin. In an embodiment, the one or more linker groups are one or more selected from the group consisting of a C1-C10 saturated or unsaturated linear, branched, or cyclic alkyl group and an electron-withdrawing group. In an embodiment, the linker groups include an electron-withdrawing group, and the electron-withdrawing groups is a carboxyl group, or a C1-C10 alkyl group substituted with one or more substituents selected from the group consisting of a halogen, a carbonyl group, a sulfonyl group, a nitro group, an ammonium group and a cyano group. In an embodiment, the electron-withdrawing group is one or more selected from the group consisting of

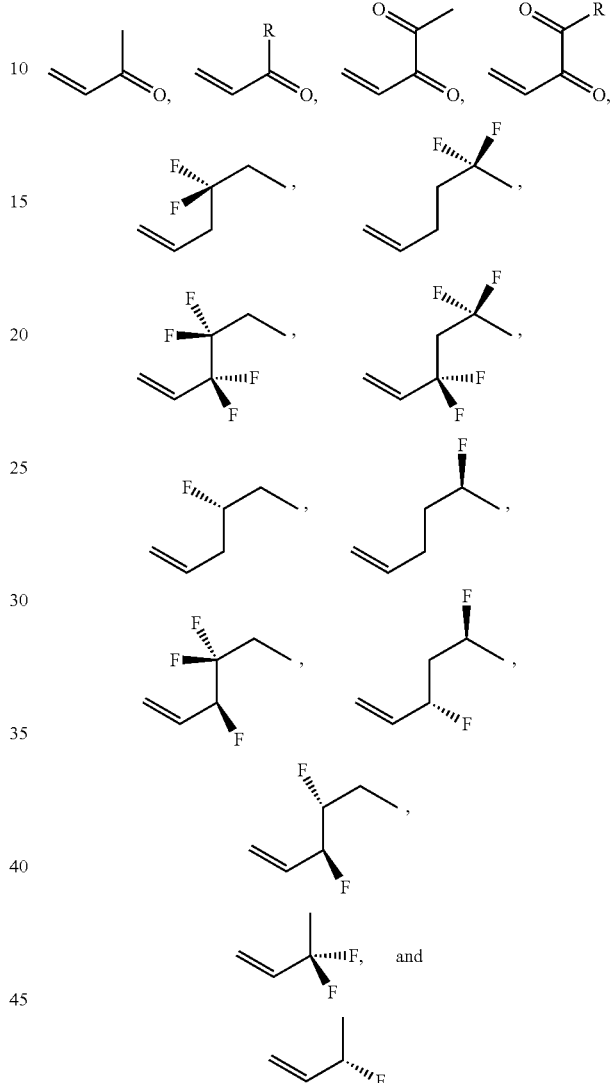

wherein R is a C1-C10 linear, branched, or cyclic alkyl group. In an embodiment, the resin includes one or more monomer units selected from the group consisting of

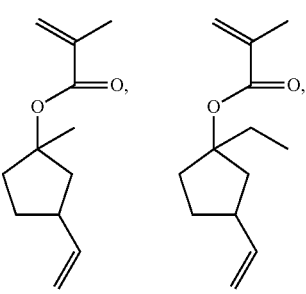

-continued

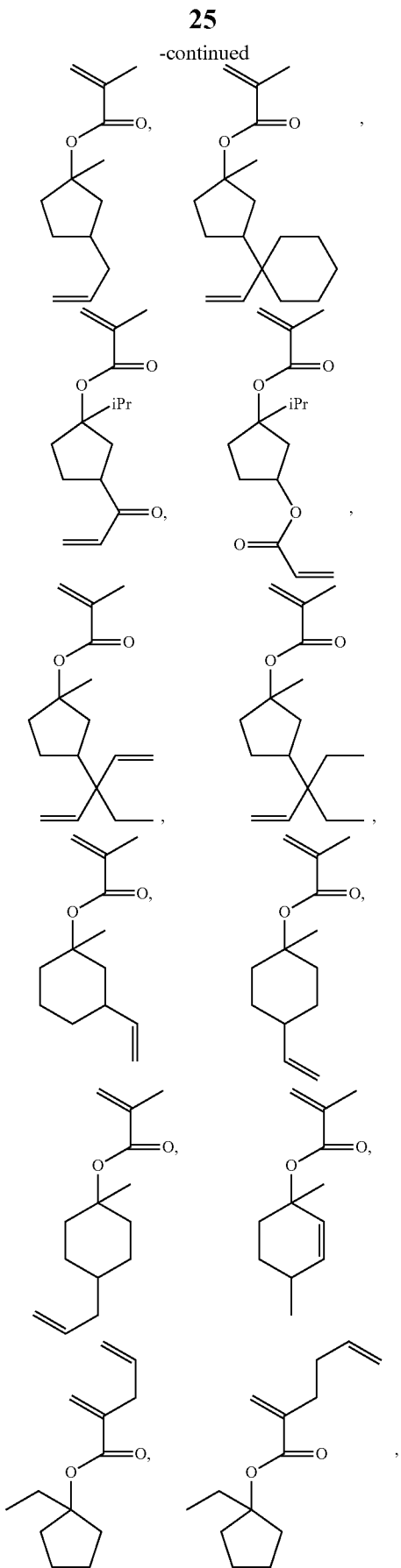

-continued

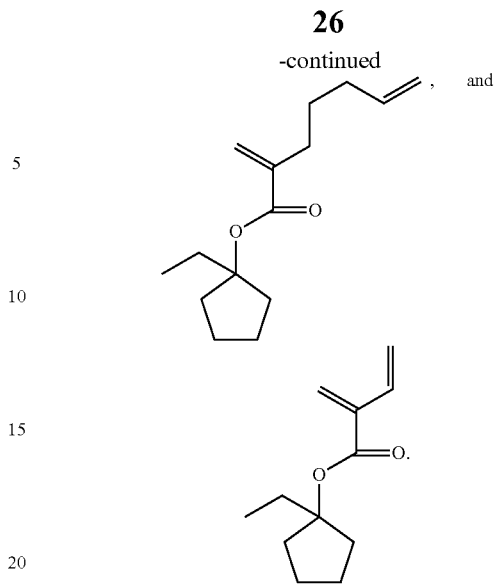

Another embodiment of the disclosure is a method for manufacturing a semiconductor device, including forming a photoresist layer comprising a photoresist composition over a substrate. The photoresist layer is selectively exposed to actinic radiation to form a latent pattern. The latent pattern is developed by applying a developer to the selectively exposed photoresist layer to form a patterned photoresist. The photoresist composition includes a photoactive compound and a resin. The resin includes: a sensitizer group, a radical-active functional group, and a linker group connecting the radical-active functional group to the sensitizer group. The sensitizer group is a C1-C18 substituted or unsubstituted aryl group. In an embodiment, the C1-C18 substituted or unsubstituted aryl group includes an —OH group substituent. In an embodiment, the linker group is selected from the group consisting of a C1-C10 linear, branched, or cyclic alkyl group and an electron-withdrawing group. In an embodiment, the linker group includes an electron-withdrawing group, and the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group. In an embodiment, the radical-active functional group is an alkene group or an alkyne group. In an embodiment, the method includes heating the photoresist layer after the selectively exposing the photoresist layer to actinic radiation and before the developing the latent pattern. In an embodiment, the method includes heating the patterned photoresist after the developing the latent pattern. In an embodiment, the method includes removing a portion of the substrate exposed by the patterned photoresist.

Another embodiment of the disclosure is a polymer resin, including: a sensitizer group, a radical-active functional group, and a linker group connecting the radical-active functional group to the sensitizer group. The sensitizer group is a C1-C18 substituted or unsubstituted aryl group. In an embodiment, the C1-C18 substituted or unsubstituted aryl group includes an —OH group substituent. In an embodiment, the linker group is selected from the group consisting of a C1-C10 linear, branched, or cyclic alkyl group and an electron-withdrawing group. In an embodiment, the linker group includes an electron-withdrawing group, and the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group. In an embodiment, the electron-withdrawing group is one or more selected from the group consisting of

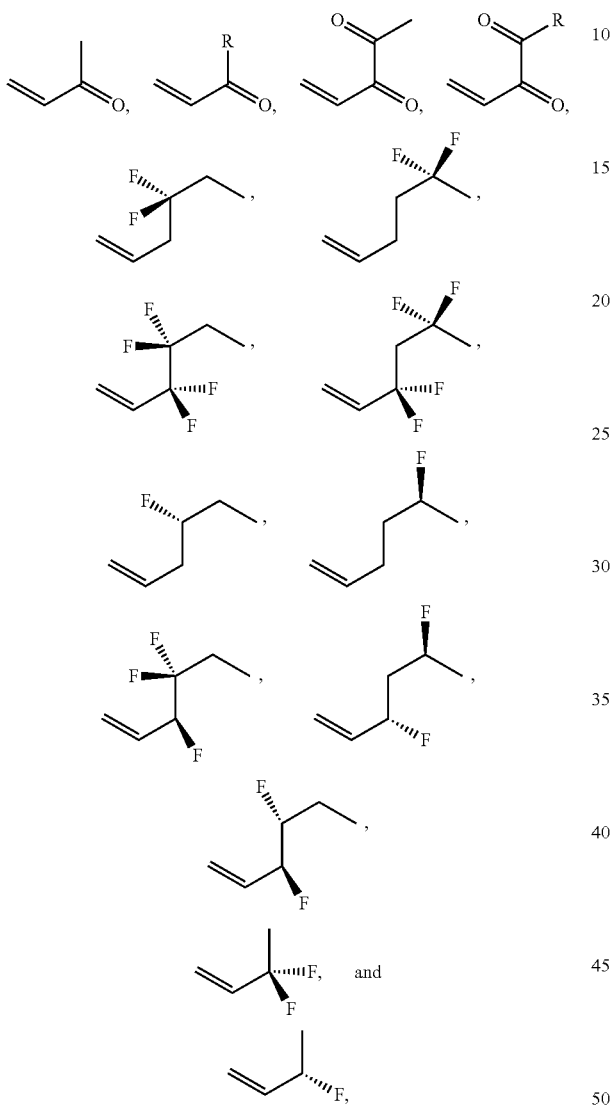

wherein R is a C1-C10 linear, branched, or cyclic alkyl group. In an embodiment, the polymer resin includes one or more monomer units selected from the group consisting of:

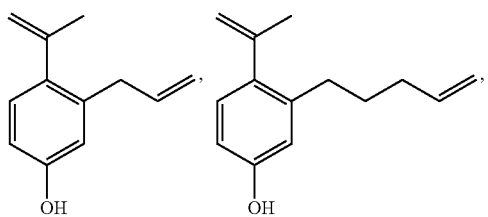

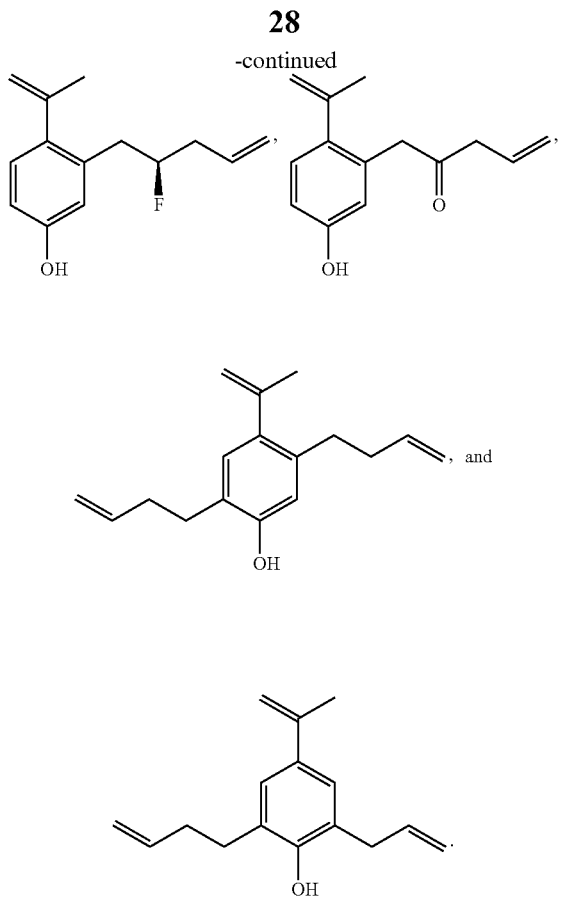

In an embodiment, the resin includes monomer units including an acid labile group. In an embodiment, the acid labile group is a C1-C20 linear, branched, or cyclic alkyl group. In an embodiment, the resin includes a radical-active functional group attached to the acid labile group. In an embodiment, the radical-active functional group is an alkene group or an alkyne group. In an embodiment, the resin includes a radical-active functional group attached to a backbone of the resin, wherein the radical-active functional group is attached to the backbone of the resin by a C1-C10 linear, branched, or cyclic alkyl group. In an embodiment, the radical-active functional group is an alkene group or an alkyne group. In an embodiment, the resin is selected from the group consisting of

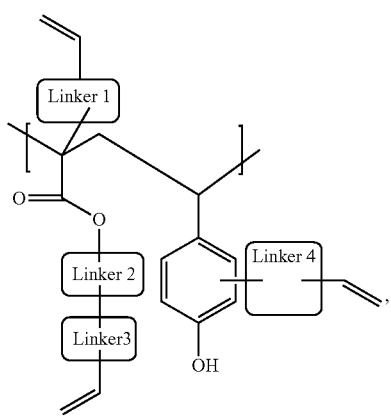

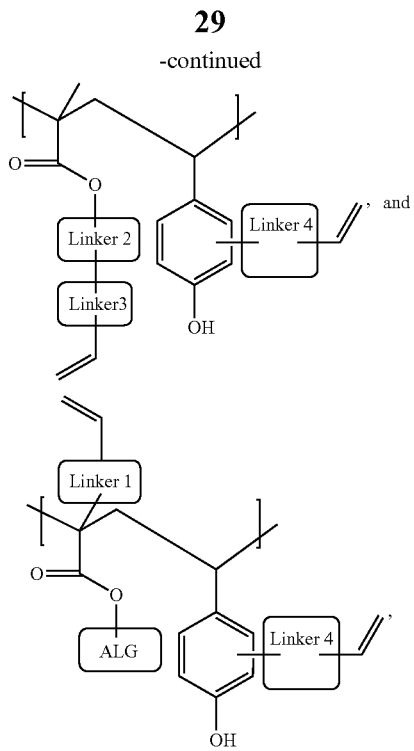

wherein Linker1 and Linker3 are independently selected from the group consisting of a direct bond, a C1-10 linear, branched, or cyclic alkyl group and an electron-withdrawing functional group; Linker2 and Linker4 are independently selected from the group consisting of a direct bond, a saturated or unsaturated C1-C10 linear, branched, or cyclic hydrocarbon group; Linker2 and Linker3 are not both direct bonds; and ALG is a C1-C20 linear, branched, or cyclic alkyl group.

Another embodiment of the disclosure is a resin, including a radical-active functional group and an acid labile group. The radical-active functional group is an alkene group or an alkyne group. In an embodiment, the radical-active functional group is attached to the acid labile group. In an embodiment, the resin includes hydroxystyrene monomer units. In an embodiment, the resin includes a sensitizer group. In an embodiment, a radical-active functional group is connected to the sensitizer group by a linker group. In an embodiment, the resin includes one or more monomer units selected from the group consisting of

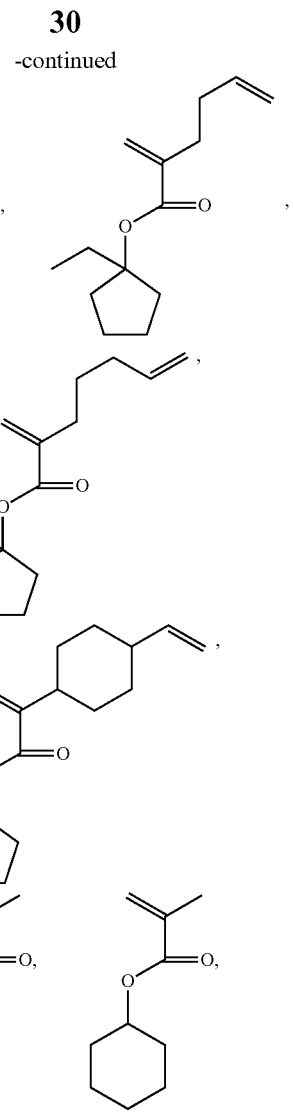

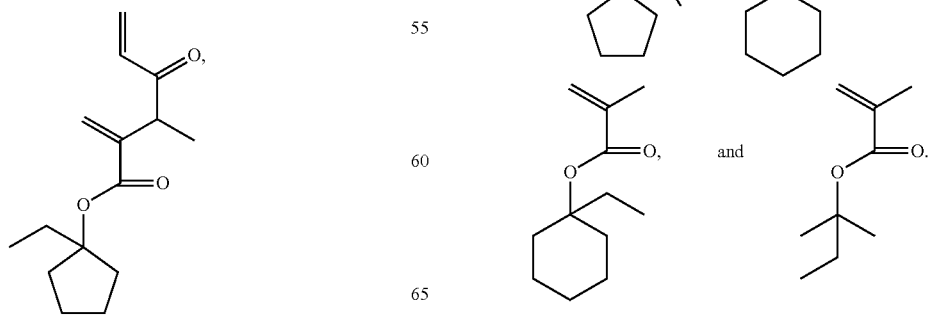

In an embodiment, the resin includes one or more linker groups connecting the radical-active functional group to the resin. In an embodiment, the one or more linker groups are one or more selected from the group consisting of a C1-C10 linear, branched, or cyclic alkyl group; a saturated or unsaturated C1-C10 linear, branched, or cyclic hydrocarbon group; and an electron-withdrawing group. In an embodiment, the linker groups include an electron-withdrawing group, and the electron-withdrawing groups is a carboxyl group, or a C1-C10 alkyl group substituted with one or more substituents selected from the group consisting of a halogen, a carbonyl group, a sulfonyl group, a nitro group, an ammonium group and a cyano group. In an embodiment, the electron-withdrawing group is one or more selected from the group consisting of wherein R is a C1-C10 linear, branched, or cyclic alkyl group. In an embodiment, the resin includes one or more monomer units selected from the group consisting of

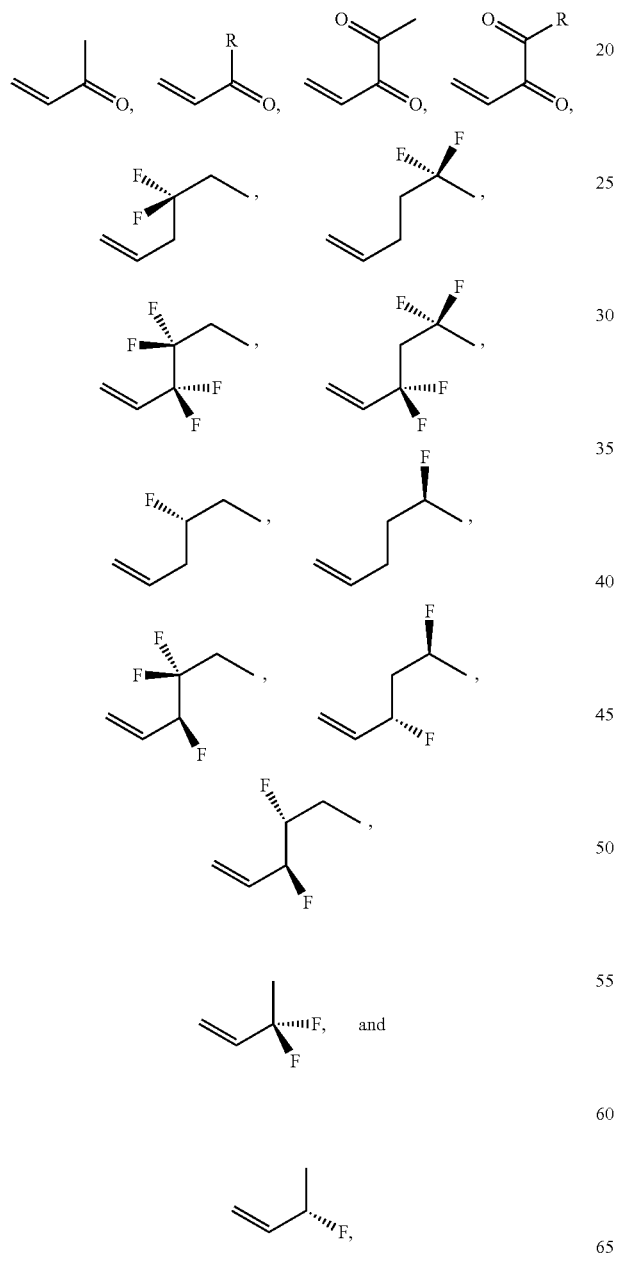

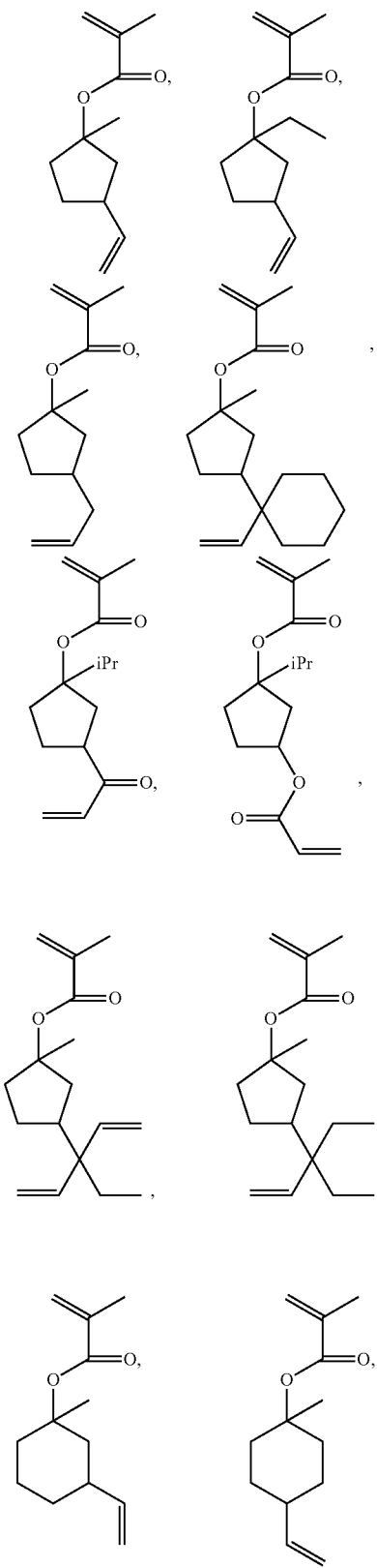

-continued

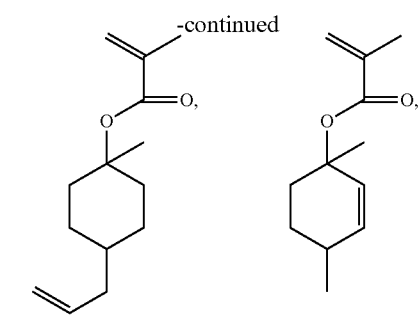

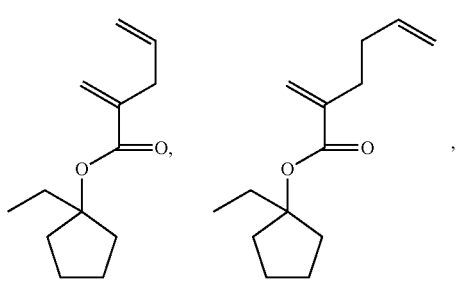

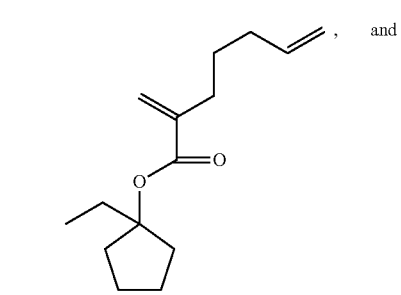

, and

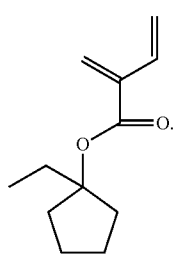

Another embodiment of the disclosure is a photoresist composition including a photoactive compound and a resin including a radical-active functional group and an acid labile group. The radical-active functional group is an alkene group or an alkyne group. In an embodiment, the photoactive compound includes one or more free radical photoinitiators or photoacid generators. In an embodiment, the radical-active functional group is attached to the acid labile group. In an embodiment, the resin includes hydroxystyrene monomer units. In an embodiment, the resin includes a sensitizer group. In an embodiment, a radical-active functional group is connected to the sensitizer group by a linker group. In an embodiment, the resin includes one or more monomer units selected from the group consisting of

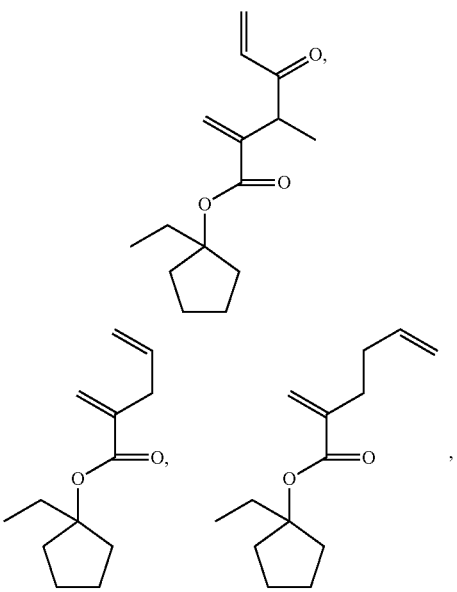

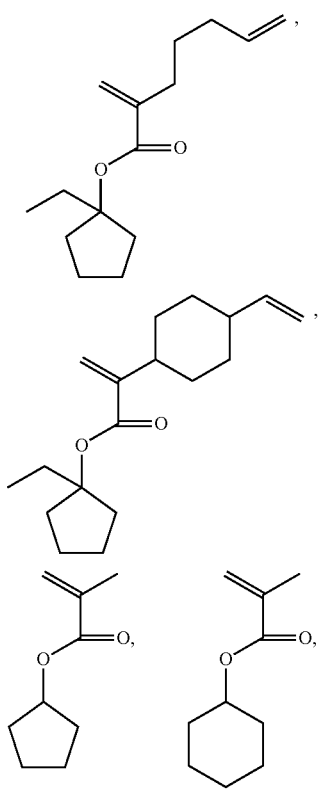

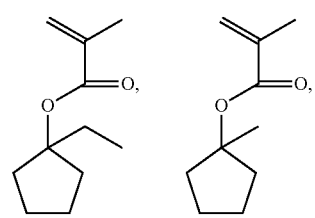

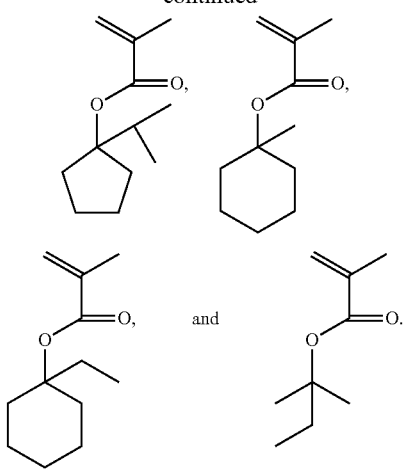

In an embodiment, the resin includes one or more linker groups connecting the radical-active functional group to the resin. In an embodiment, the one or more linker groups are one or more selected from the group consisting of a C1-C10 linear, branched, or cyclic alkyl group; a saturated or unsaturated C1-C10 linear, branched, or cyclic hydrocarbon group; and an electron-withdrawing group. In an embodiment, the linker groups include an electron-withdrawing group, and the electron-withdrawing groups is a carboxyl group, or a C1-C10 alkyl group substituted with one or more substituents selected from the group consisting of a halogen, a carbonyl group, a sulfonyl group, a nitro group, an ammonium group and a cyano group. In an embodiment, the electron-withdrawing group is one or more selected from the group consisting of

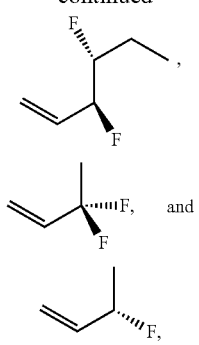

wherein R is a C1-C10 linear, branched, or cyclic alkyl group. In an embodiment, the resin includes one or more monomer units selected from the group consisting of

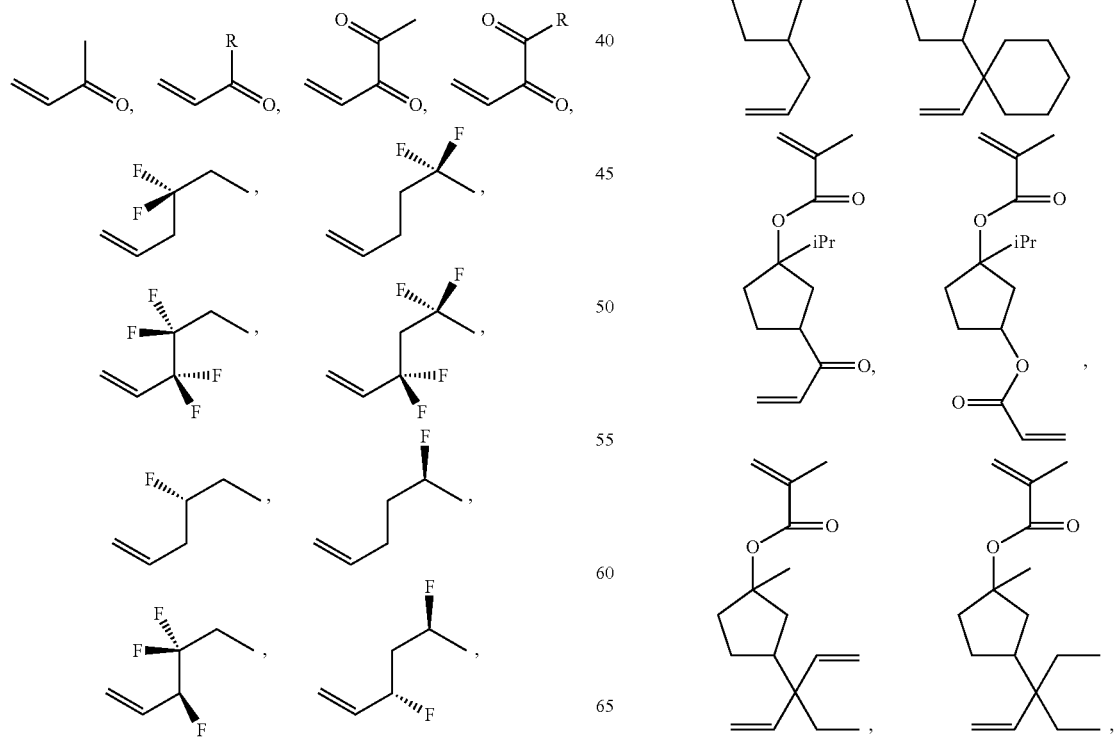

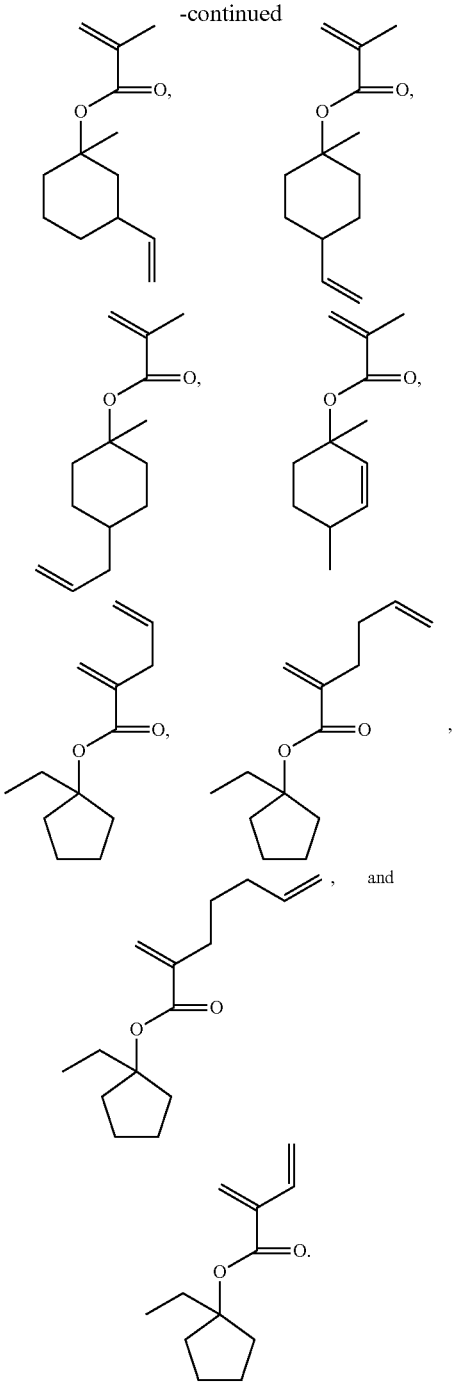

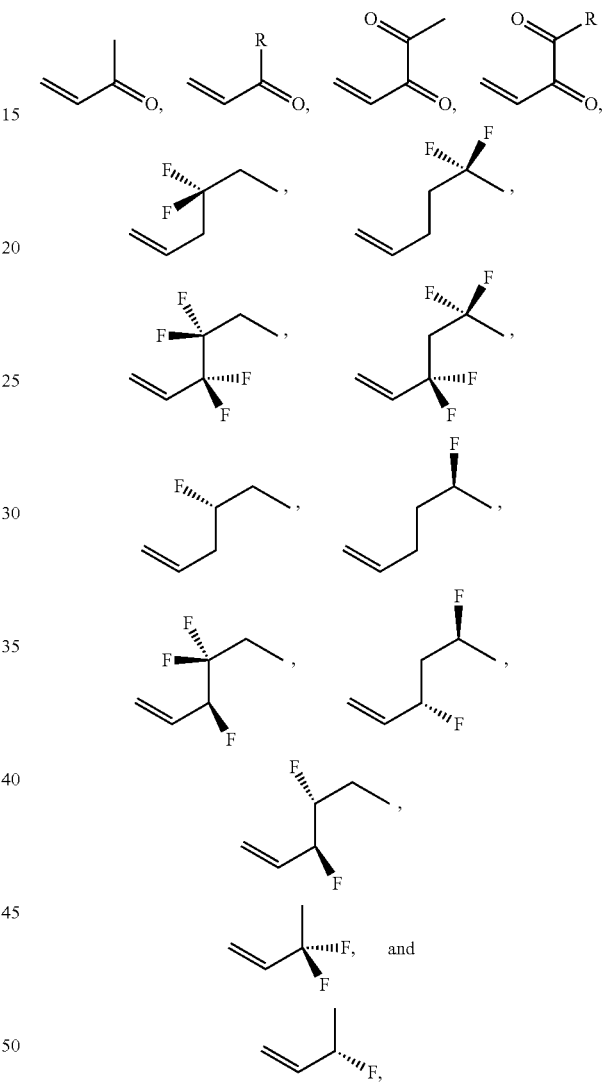

withdrawing group. In an embodiment, the linker group includes an electron-withdrawing group, and the electron-withdrawing group is a carboxyl group, or a C1-C10 alkyl group substituted with one or more substituents selected from the group consisting of a halogen, a carbonyl group, a sulfonyl group, a nitro group, an ammonium group, and a cyano group. In an embodiment, the electron-withdrawing group is one or more selected from the group consisting of wherein R is a C1-C10 linear, branched, or cyclic alkyl group. In an embodiment, the resin comprises one or more monomer units selected from the group consisting of:

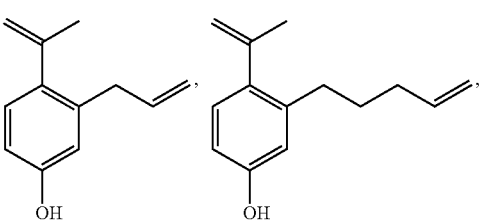

Another embodiment of the disclosure is a photoresist composition, including a photoactive compound and a resin. The resin includes: a sensitizer group, a radical-active functional group, and a linker group connecting the radical-active functional group to the sensitizer group. The sensitizer group is a C1-C18 substituted or unsubstituted aryl group. In an embodiment, the photoactive compound comprises one or more free radical photoinitiators or photoacid generators. In an embodiment, the C1-C18 substituted or unsubstituted aryl group includes an —OH group substituent. In an embodiment, the linker group is selected from the group consisting of a saturated or unsaturated C1-C10 linear, branched, or cyclic hydrocarbon group and an electron- -continued

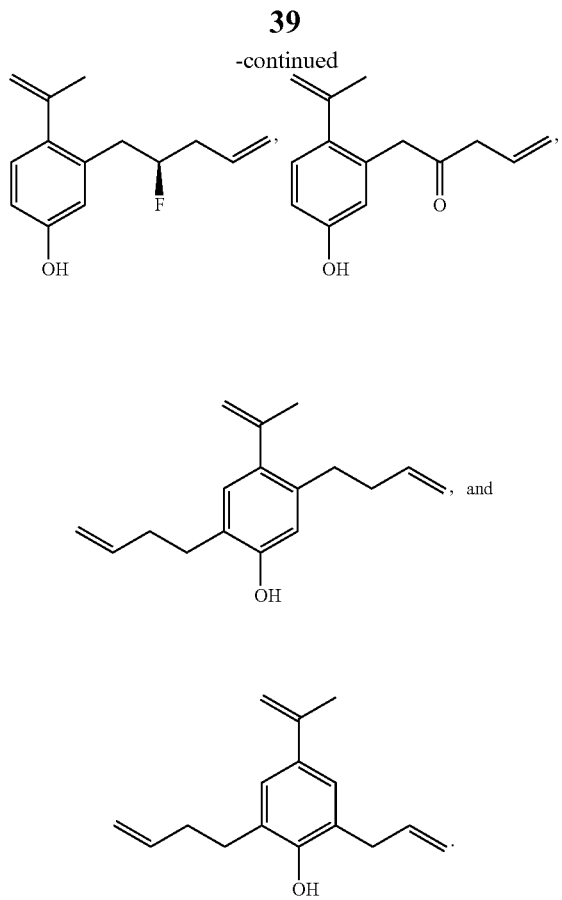

In an embodiment, the resin includes monomer units including an acid labile group. In an embodiment, the acid labile group is a C1-C20 linear, branched, or cyclic alkyl group. In an embodiment, the resin includes a radical-active functional group attached to the acid labile group. In an embodiment, the radical-active functional group is an alkene group or an alkyne group. In an embodiment, the resin includes a radical-active functional group attached to a backbone of the resin, wherein the radical-active functional group is attached to the backbone of the resin by a C1-C10 linear, branched, or cyclic alkyl group. In an embodiment, the radical-active functional group is an alkene group or an alkyne group. In an embodiment, the resin is selected from the group consisting of:

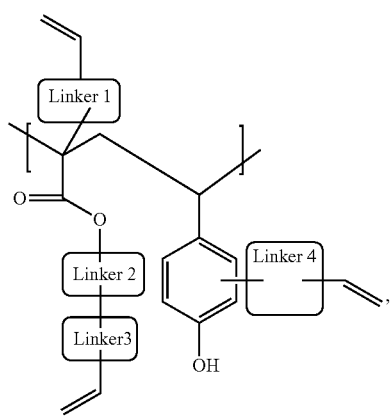

-continued

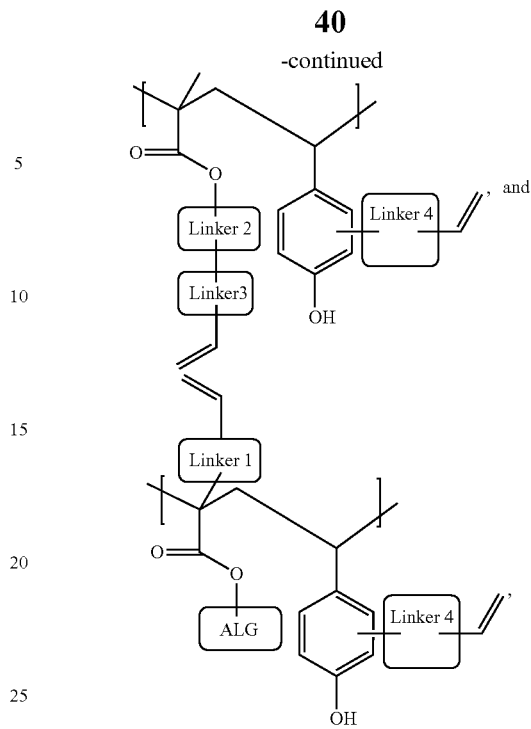

wherein Linker1 and Linker3 are independently selected from the group consisting of a direct bond, a C1-10 linear, branched, or cyclic alkyl group and an electron-withdrawing functional group; Linker2 and Linker4 are independently selected from the group consisting of a direct bond, a saturated or unsaturated C1-C10 linear, branched, or cyclic hydrocarbon group; Linker2 and Linker3 are not both direct bonds; and ALG is a C1-C20 linear, branched, or cyclic alkyl group.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist composition, comprising:
    a photoactive compound; and
    a resin comprising a radical-active functional group and an acid labile group,
    wherein the radical-active functional group is an alkene group or an alkyne group,
    wherein the resin further comprises one or more linker groups connecting the radical-active functional group to the resin, and
    wherein the linker groups include an electron-withdrawing group, and the electron-withdrawing group is one or more selected from the group consisting of

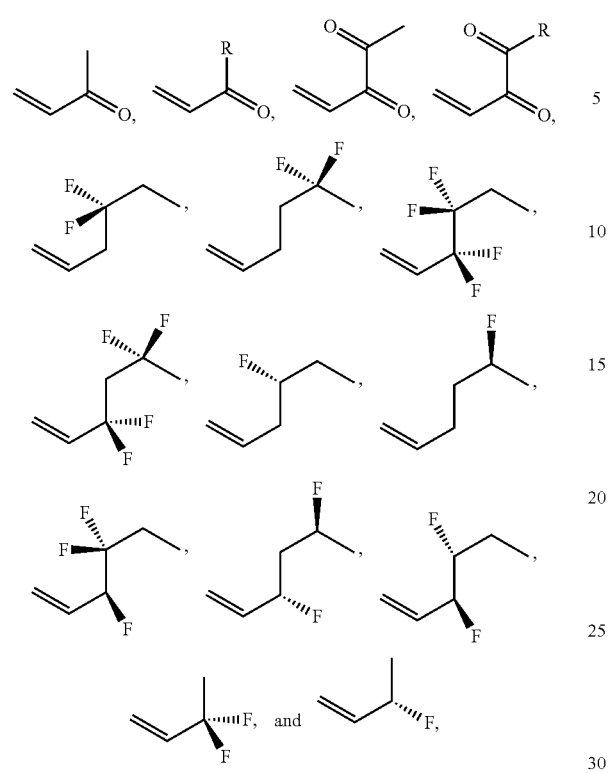

wherein R is a C1-C10 linear, branched, or cyclic alkyl group.

2. The photoresist composition of claim 1, wherein the photoactive compound comprises one or more free radical photoinitiators or photoacid generators.

3. The photoresist composition of claim 1, wherein the acid labile group is a C1-C20 linear, branched, or cyclic alkyl group.

4. The photoresist composition of claim 1, wherein the radical-active functional group is attached to the acid labile group.

5. The photoresist composition of claim 1, wherein the resin further comprises hydroxystyrene monomer units.

6. The photoresist composition of claim 1, wherein the resin further comprises one or more monomer units selected from the group consisting of

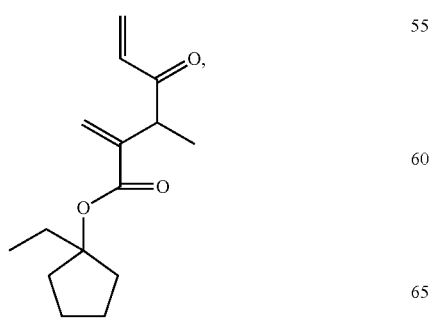

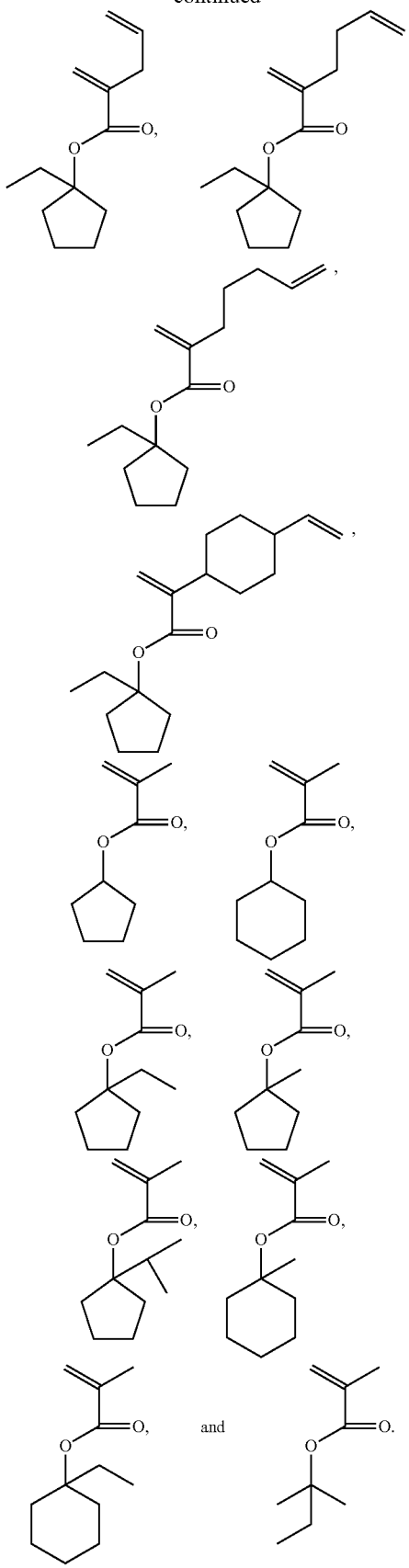

7. The photoresist composition of claim 1, wherein the resin further comprises one or more monomer units selected from the group consisting of

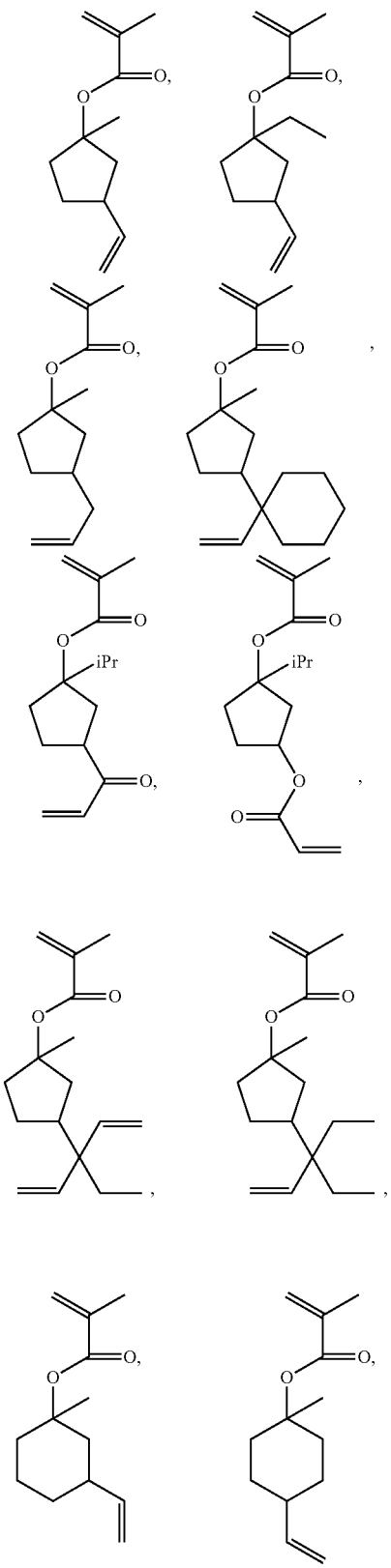

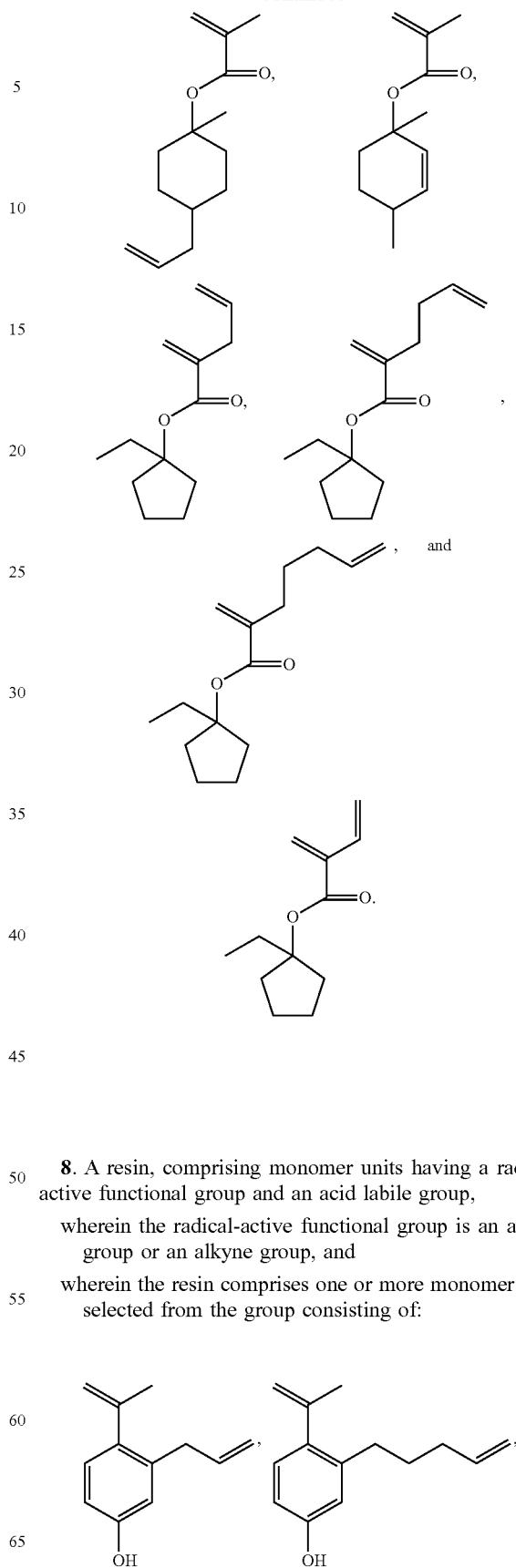

8. A resin, comprising monomer units having a radical-active functional group and an acid labile group, wherein the radical-active functional group is an alkene group or an alkyne group, and wherein the resin comprises one or more monomer units selected from the group consisting of:

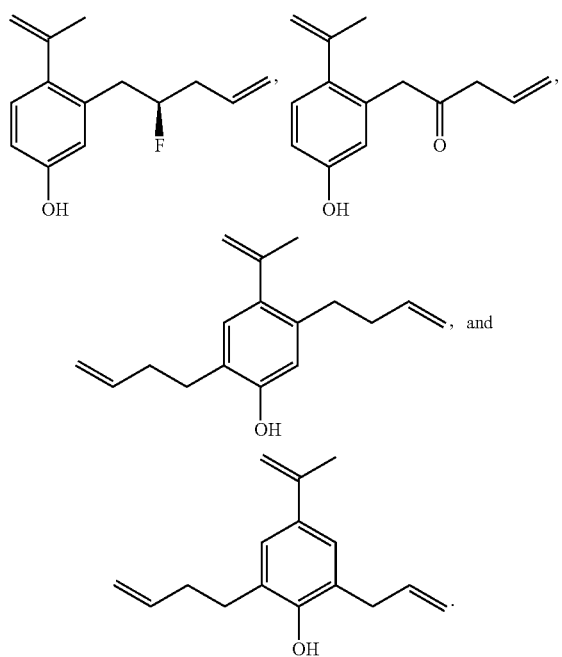

9. The resin of claim 8, wherein the resin further comprises one or more linker groups connecting the radical-active functional group to the resin.

10. The resin of claim 9, wherein the one or more linker groups are one or more selected from the group consisting of a C1-C10 linear, branched, or cyclic alkyl group; a saturated or unsaturated C1-C10 linear, branched, or cyclic hydrocarbon group; and an electron-withdrawing group.

11. The resin of claim 9, wherein the linker groups include an electron-withdrawing group, and the electron-withdrawing groups is a carboxyl group, or a C1-C10 alkyl group substituted with one or more substituents selected from the group consisting of a halogen, a carbonyl group, a sulfonyl group, a nitro group, an ammonium group, and a cyano group.

12. The resin of claim 9, wherein the linker groups include an electron-withdrawing group, and the electron-withdrawing group is one or more selected from the group consisting of

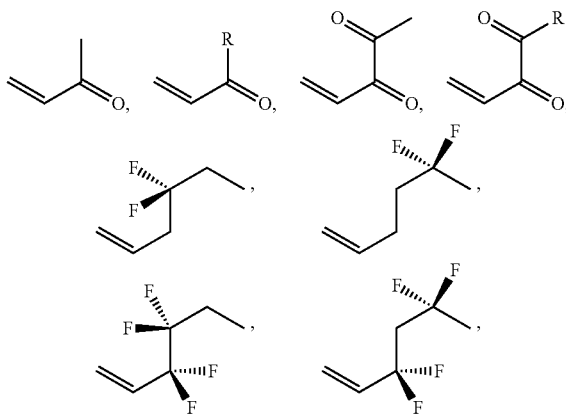

wherein R is a C1-C10 linear, branched, or cyclic alkyl group.

13. A photoresist composition, comprising:

a photoactive compound; and a resin including a radical-active functional group, an acid labile group, and a sensitizer group, wherein the radical-active functional group is an alkene group or an alkyne group, the radical-active functional group is connected to the sensitizer group by a first linker group, the resin further comprises one or more second linker groups connecting the radical-active functional group to the resin, and the first and second linker groups are electron-withdrawing groups selected from the group consisting of

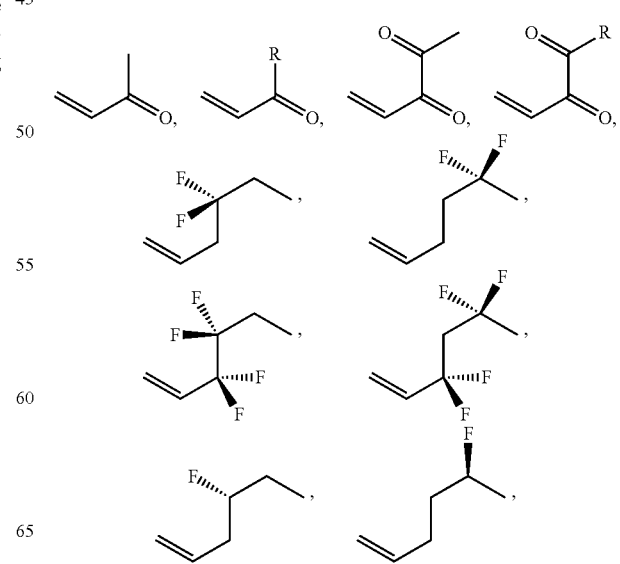

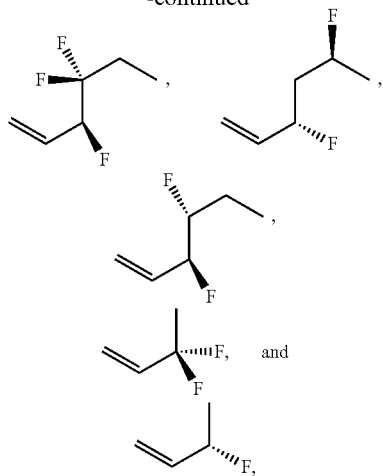

wherein R is a C1-C10 linear, branched, or cyclic alkyl group.

14. The photoresist composition of claim 13, wherein the radical-active functional group is attached to the acid labile group.

15. The photoresist composition of claim 1, wherein the one or more linker groups further comprise one or more substituents selected from the group consisting of a halogen, a carbonyl group, a sulfonyl group, a nitro group, an ammonium group, and a cyano group.

16. The resin of claim 8, wherein the radical-active functional group is attached to the acid labile group.

17. The resin of claim 8, wherein the resin further comprises hydroxystyrene monomer units.

18. The resin of claim 8, wherein the acid labile group is a C1-C20 linear, branched, or cyclic alkyl group.

19. The resin of claim 8, further comprising one or more monomer units selected from the group consisting of

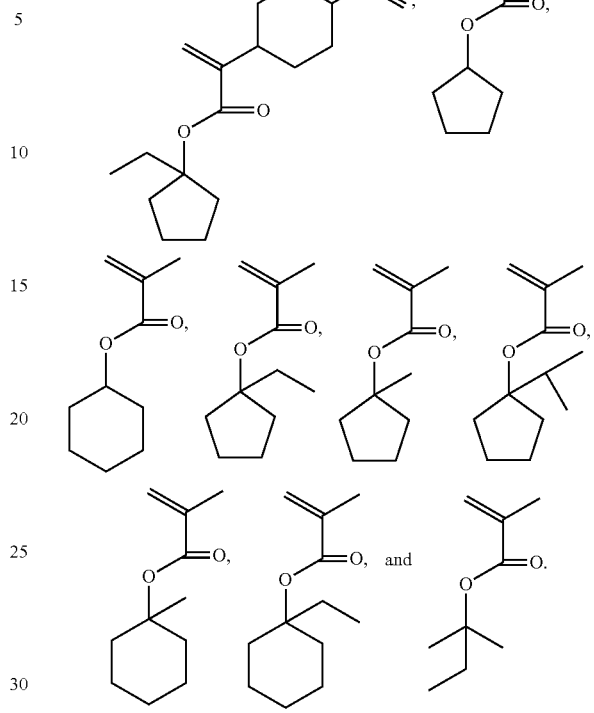

20. The resin of claim 8, further comprising one or more monomer units selected from the group consisting of

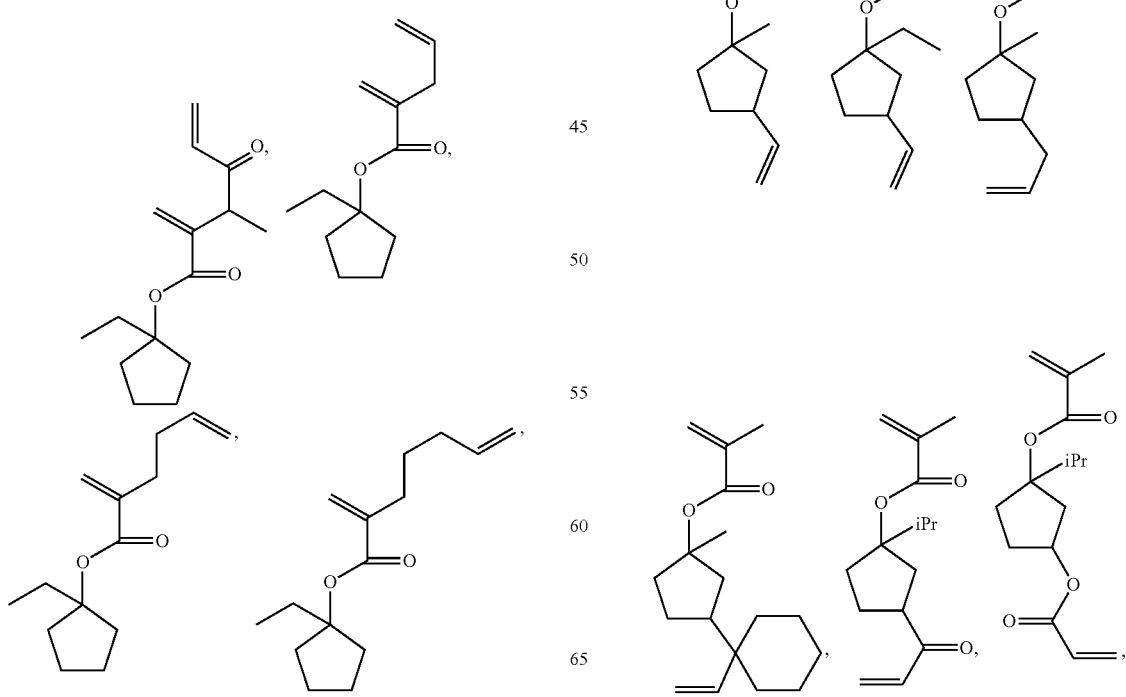

-continued
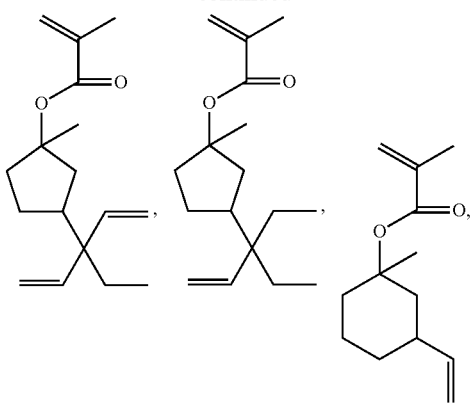
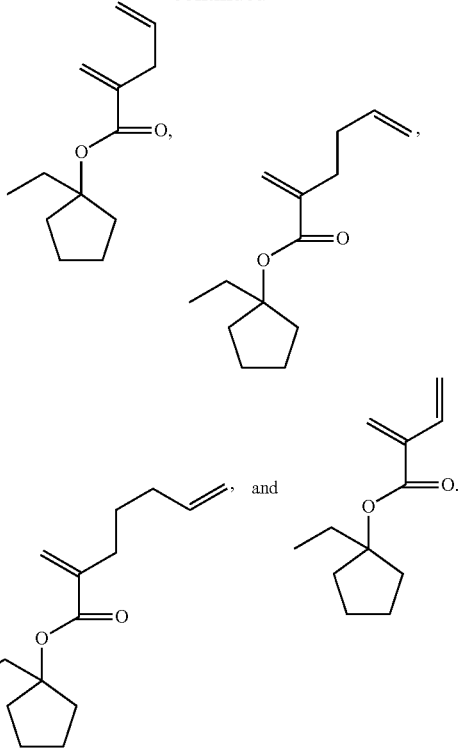
* * * * *